US009805812B2

(12) United States Patent
Kwak

(10) Patent No.: US 9,805,812 B2
(45) Date of Patent: Oct. 31, 2017

(54) OPERATING METHOD OF STORAGE DEVICE

(71) Applicant: Donghun Kwak, Hwaseong-si (KR)

(72) Inventor: Donghun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 14/668,086

(22) Filed: Mar. 25, 2015

(65) Prior Publication Data

US 2015/0340099 A1   Nov. 26, 2015

(30) Foreign Application Priority Data

May 26, 2014 (KR) .................. 10-2014-0063127

(51) Int. Cl.
| | | |
|---|---|---|
| G06F 12/02 | (2006.01) | |
| G11C 16/34 | (2006.01) | |
| G11C 16/16 | (2006.01) | |
| G11C 11/56 | (2006.01) | |
| G11C 16/12 | (2006.01) | |
| G11C 29/02 | (2006.01) | |

(52) U.S. Cl.
CPC .......... *G11C 16/34* (2013.01); *G11C 11/5628* (2013.01); *G11C 11/5642* (2013.01); *G11C 16/12* (2013.01); *G11C 16/16* (2013.01); *G11C 29/021* (2013.01); *G11C 29/028* (2013.01)

(58) Field of Classification Search
CPC . G11C 11/5628; G11C 11/5642; G11C 16/12; G11C 16/16; G11C 16/34; G11C 29/021; G11C 29/028
See application file for complete search history.

(56) References Cited

U.S. PATENT DOCUMENTS

| | | |
|---|---|---|
| 7,437,498 B2 | 10/2008 | Ronen |
| 7,916,534 B2 | 3/2011 | Shimizu et al. |
| 8,259,497 B2 | 9/2012 | Shalvi et al. |
| 8,305,812 B2 | 11/2012 | Levy et al. |
| 8,627,257 B2 | 1/2014 | Kim et al. |
| 2012/0239858 A1 | 9/2012 | Melik-Martirosian |
| 2012/0268994 A1 | 10/2012 | Nagashima |
| 2012/0294104 A1 | 11/2012 | Mun et al. |
| 2013/0159610 A1 | 6/2013 | Kawamura |
| 2013/0182506 A1 | 7/2013 | Melik-Martirosian |
| 2013/0339586 A1 | 12/2013 | Weingarten et al. |
| 2014/0226412 A1* | 8/2014 | Yeh ..................... G11C 11/5628 365/185.21 |

* cited by examiner

*Primary Examiner* — Yong Choe
(74) *Attorney, Agent, or Firm* — Volentine & Whitt, PLLC

(57) ABSTRACT

An operating method of a storage device which includes a nonvolatile memory is provided. The operating method includes performing a first program operation on selected memory cells of the nonvolatile memory and storing a first time when the first program operation is performed; and adjusting a program parameter according to a difference between the first time and a second time, and performing a second program operation on the selected memory cells using the adjusted program parameter, the second time being a time when the second program operation is performed.

10 Claims, 23 Drawing Sheets

FIG. 4
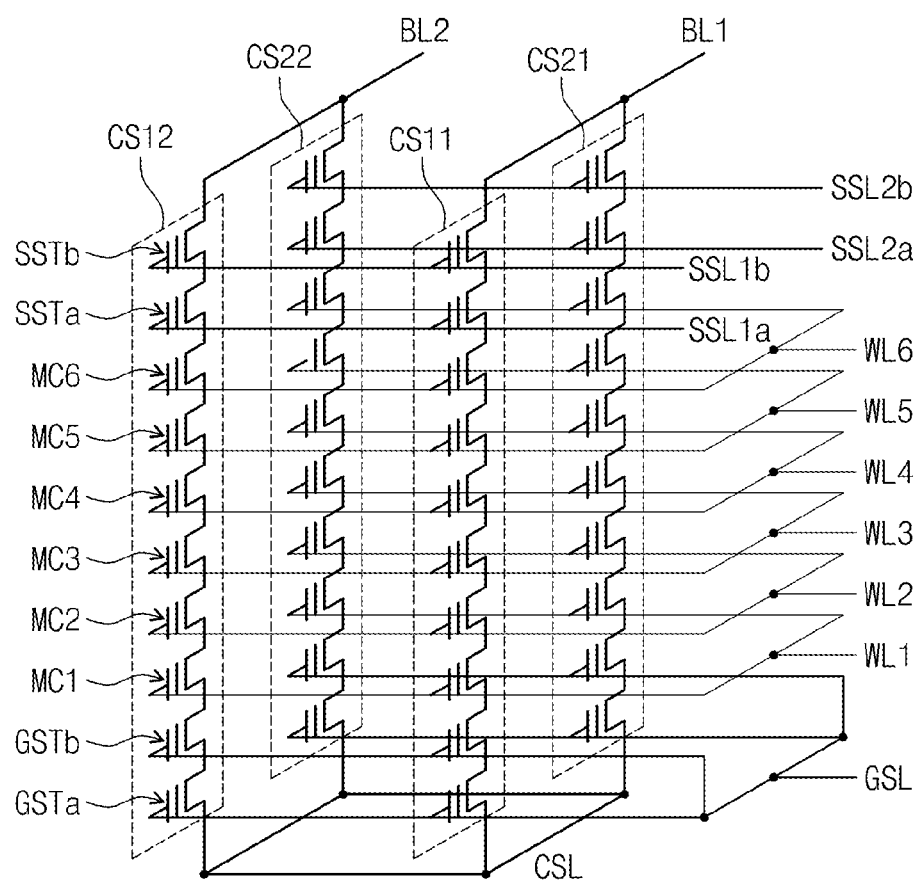
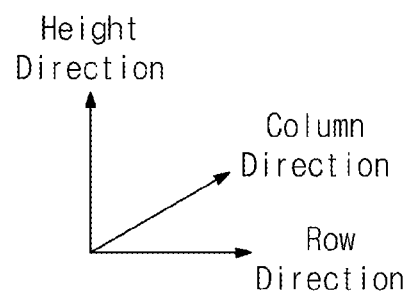

FIG. 8

| Parameter \ Elapse Time | T≤T1 | T1<T≤T2 | T2<T |
|---|---|---|---|
| Increment of VPGM | VI1 | VI2 (>VI1) | VI3 (>VI2) |
| Start Voltage of VPGM | VS1 | VS2 (<VS1) | VS3 (<VS2) |
| Program Verification Voltage | VFY1 | VFY2 (<VFY1) | VFY3 (<VFY2) |
| Precharge Voltage for BL | VPRE1 | VPRE2 (<VPRE1) | VPRE3 (<VPRE2) |
| Develop Time for Program Verification | TD1 | TD2 (<TD1) | TD3 (<TD2) |

OPERATING METHOD OF STORAGE DEVICE

CROSS-REFERENCE TO RELATED APPLICATIONS

A claim for priority under 35 U.S.C. §119 is made to Korean Patent Application No. 10-2014-0063127 filed May 26, 2014, the entire contents of which are hereby incorporated by reference.

BACKGROUND

The inventive concepts described herein relate to a semiconductor memory, and more particularly, to an operating method of a storage device.

A storage device may store data according to a control of a host device such as a computer, a smart phone, a smart pad, and so on. The storage device may typically contain a device such as a Hard Disk Drive (HDD) which stores data on a magnetic disk, or a semiconductor memory such as Solid State Drive (SSD) or memory card in particular which stores data in a nonvolatile memory.

Such nonvolatile memory may include ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), FRAM (Ferroelectric RAM), or the like.

The advancement of semiconductor fabrication technology has enabled improved operating speed of host devices such as a computers, smart phones, or smart pads that communicates with storage devices. Along with improved operating speed of host devices, there is demand to increase the capacity of content used in storage devices and host devices connected to the storage devices. Thus, improvement of operating speed of storage devices is increasingly required.

SUMMARY

Example embodiments of the inventive concept provide an operating method of a storage device which includes a nonvolatile memory. The operating method includes performing a first program operation on selected memory cells of the nonvolatile memory, and storing a first time when the first program operation is performed. The operating method further includes adjusting a program parameter according to a difference between the first time and a second time, and performing a second program operation on the selected memory cells using the adjusted program parameter. The second time is a time when the second program operation is performed.

In example embodiments, during the second program operation, a program voltage is iteratively applied to a word line connected to the selected memory cells. The program parameter includes an increment of the program voltage iteratively applied to the word line, and the adjusting includes increasing the increment as the difference increases.

In example embodiments, during the second program operation, a program voltage is iteratively applied to a word line connected to the selected memory cells. The program parameter includes a level of a first program voltage applied to the word line connected to the selected memory cells, and the adjusting includes decreasing the level of the first program voltage when the difference increases.

In example embodiments, the second program operation includes iteratively performing a program loop by applying a program voltage to a word line connected to the selected memory cells, and then applying a program verification voltage to the word line connected to the selected memory cells. The program parameter includes a level of the program verification voltage, and the adjusting includes decreasing the level of the program verification voltage when the difference increases.

In example embodiments, the second program operation includes iteratively performing a program loop by applying a program voltage to a word line connected to the selected memory cells, and then performing a program verification operation on the selected memory cells. The program parameter includes levels of pre-charge voltages applied to bit lines connected to the selected memory cells during the program verification operation, and the adjusting includes decreasing the levels of the pre-charge voltages when the difference increases.

In example embodiments, the second program operation includes iteratively performing a program loop by applying a program voltage to a word line connected to the selected memory cells, and then performing a program verification operation on the selected memory cells. During the program verification operation, pre-charge voltages are applied to bit lines connected to the selected memory cells, a program verification voltage is applied to a word line connected to the selected memory cells, and voltages of the bit lines are latched after a develop time. The program parameter includes the develop time, and the adjusting includes decreasing the develop time when the difference increases.

In example embodiments, the program parameter is adjusted according to the difference and environment information. The environment information includes at least one of a number of erase operations performed on the selected memory cells, a difference between a temperature when the first program operation is performed and a current temperature, and importance of data programmed in the selected memory cells.

In example embodiments, the operating method further includes storing the second time, and readjusting the program parameter according to a difference between the second time and a third time. A third program operation is performed on the selected memory cells using the readjusted program parameter. The third time is a time when the third program operation is performed.

In example embodiments, the operating method further includes performing a read operation on the selected memory cells when a reset of the storage device occurs after the first program operation is performed and before the second program operation is performed. The difference is calculated according to a result of the read operation.

In example embodiments, the first time is stored in the nonvolatile memory. During performing of the second program operation, the first time is read from the nonvolatile memory and the program parameter is adjusted according to a difference between the read first time and the second time.

In example embodiments, the first program operation and the second program operation include programming the selected memory cells using a same data.

In example embodiments, the operating method further comprises receiving a clock signal, wherein an internal time of the storage device is counted according to the clock signal. The first and second times are acquired based on the internal time.

In example embodiments, the clock signal is a signal that periodically transitions and indicates lapse of time or information on an actual time.

Example embodiments of the inventive concept provide an operating method of a storage device which includes a nonvolatile memory. The operating method includes performing a first program operation on selected memory cells of the nonvolatile memory, and storing a first time when the first program operation is performed. The operating method further includes performing a second program operation on the selected memory cells, and storing a flag according to an elapse time from the first time to a second time; and adjusting a read parameter according to the flag. The operating method further includes performing a read operation on the selected memory cells using the adjusted read parameter. The second time is a time when the second program operation is performed.

In example embodiments, during the read operation, a read voltage is applied to a word line connected to the selected memory cells. The read parameter includes a level of the read voltage. The adjusting includes increasing the level of the read voltage when the elapse time as indicated by the flag increases.

Example embodiments of the inventive concept provide a memory storage device. The memory storage device includes a nonvolatile memory, and further includes a memory controller configured to program first data in selected memory cells of the nonvolatile memory during a first programming operation, reprogram the first data in the selected memory cells during a second programming operation, and adjust a program parameter used during the second programming operation according to respective first and second times when the first and second programming operations are performed.

In example embodiments, the memory controller is configured to adjust the program parameter used during the second programming operation according to a difference between the first and second times.

In example embodiments, the memory controller is further configured to adjust the program parameter according to environment information. The environment information includes at least one of a number of erase operations performed on the selected memory cells, a difference between a temperature when the first program operation is performed and a current temperature, and importance of data programmed in the selected memory cells.

In example embodiments, the memory controller is further configured to reprogram the first data in the selected memory cells during a third programming operation, and readjust the program parameter used during the third programming operation according to a difference between the second time and a third time when the third programming operation is performed.

In example embodiments, the memory controller is further configured to perform a read operation on the selected memory cells when a reset operation of the memory storage device occurs after the first programming operation and before the second programming operation. The difference is determined according to a result of the read operation.

In the example embodiments of the inventive concept, positions of valleys where threshold voltage distribution ranges of programmed memory cells are overlapped are constantly maintained. As a result, operations related to detecting positions of valleys are unnecessary, and operating speed is improved.

BRIEF DESCRIPTION OF THE FIGURES

Example embodiments of the inventive concept will become apparent from the following description with reference to the following figures, wherein like reference numerals refer to like parts throughout the various figures unless otherwise specified.

FIG. 4 is a circuit diagram schematically illustrating a memory block according to an embodiment of the inventive concept.

FIG. 8 is a table showing program parameters, according to an embodiment of the inventive concept.

DETAILED DESCRIPTION

Figure 1:
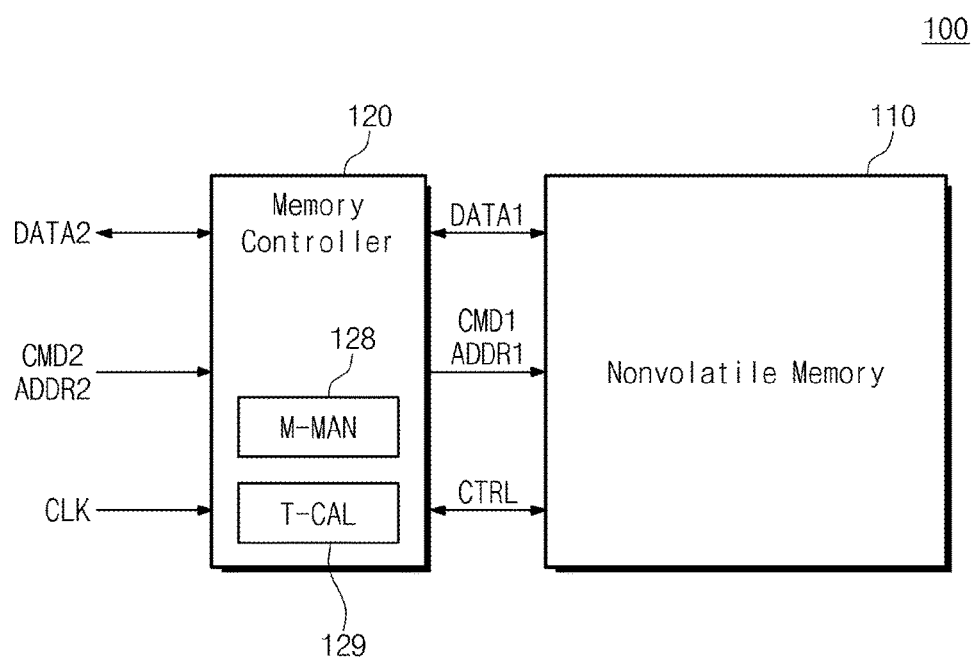
FIG. 1 is a block diagram schematically illustrating a storage device according to an embodiment of the inventive concept.

Embodiments of the inventive concept will be described in detail with reference to the accompanying drawings. The inventive concept may however be embodied in various different forms, and should not be construed as being limited only to the illustrated embodiments. Rather, these embodiments are provided as examples so that this disclosure will be thorough and complete, and will fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 100 according to an embodiment of the inventive concept. Referring to FIG. 1, a storage device 100 contains a nonvolatile memory 110 and a memory controller 120.

The nonvolatile memory 110 may perform read, write, and erase operations according to a control of the memory controller 120. The nonvolatile memory 110 may exchange first data DATA1 with the memory controller 120. For example, the nonvolatile memory 110 may receive write data from the memory controller 120 and store the write data thus received. The nonvolatile memory 110 may perform a read operation and output the read data to the memory controller 120.

The nonvolatile memory 110 may receive a first command CMD1 and a first address ADDR1 from the memory controller 120. For example, the first command CMD1 and the first address ADDR may be transmitted from the memory controller 120 to the nonvolatile memory 110 through the same channel as the first data DATA1.

The nonvolatile memory 110 may exchange a control signal CTRL with the memory controller 120. For example, the nonvolatile memory 110 may receive from the memory controller 120 at least one of a chip enable signal nCE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal nRE received from the memory controller 120 at a read operation and used to tune timing, a write enable signal nWE received from the memory controller 120 at a write operation and used to tune timing, and a data strobe signal DQS used to adjust input synchronization of the first data DATA1. For example, the nonvolatile memory 110 may output to the memory controller 120 at least one of a ready/busy signal R/nB indicating whether the nonvolatile memory 110 performs a program, erase or read operation and a data strobe signal DQS used to adjust output synchronization of the first data DATA1.

The nonvolatile memory 110 may include a flash memory. However, the inventive concept is not limited thereto. For example, the nonvolatile memory 110 may incorporate at least one of nonvolatile memories such as PRAM (Phase-change RAM), MRAM (Magnetic RAM), RRAM (Resistive RAM), FeRAM (Ferroelectric RAM), and so on.

The memory controller 120 is configured to control the nonvolatile memory 110. For example, the memory controller 120 may control the nonvolatile memory 110 to perform a read, write, or erase operation. The memory controller 120 may exchange the first data DATA1 and the control signal CTRL with the nonvolatile memory 110 and may output the first command CMD1 and the first address ADDR1 to the nonvolatile memory 110.

The memory controller 120 controls the nonvolatile memory 110 according to a control of an external host device (not shown). The memory controller 120 may exchange second data DATA2 with the host device and receives a second command CMD2, a second address ADDR2, and a clock signal CLK from the host device.

The memory controller 120 may receive the second data DATA2 from the host device and writes the second data DATA2 at the nonvolatile memory 110 as the first data DATA1. The memory controller 120 may receive the first data DATA1 from the nonvolatile memory 110 and output the first data DATA1 to the host device as the second data DATA2. In example embodiments, the memory controller may 120 exchange the first data DATA1 with the nonvolatile memory 110 by a first unit, and may exchange the second data DATA2 with the host device by a second unit different from the first unit.

The memory controller 120 may exchange the first data DATA1 with the nonvolatile memory 110 according to a first format, and transmit the first command CMD1 and the first address ADDR1 to the nonvolatile memory 110. The memory controller 120 may exchange the second data DATA2 with the host device according to a second format different from the first format, and receive the second command CMD2 and the second address ADDR2 from the host device.

For example, the memory controller 120 may receive from the host device a signal, which periodically transitions and indicates the lapse of time, as the clock signal CLK. Alternatively, the memory controller 120 may receive from the host device a current time, which is calculated in the host device, as the clock signal CLK. Or, the memory controller 120 may receive from the host device a signal which periodically transitions, and a current time as the clock signal CLK. In this case, the current time may be provided to the memory controller 120 once when a power is supplied to the memory controller 120, or when the host device determines that it is necessary to provide the current time. The memory controller 120 may then acquire time information using the clock signal CLK and may control the nonvolatile memory 110 using the acquired time information.

The memory controller 120 may contain a memory manager 128 and a time calculator 129. The memory manager 128 may control the nonvolatile memory 110 according to the second command CMD2 received from the host device and according to a schedule decided in the memory controller 120. During a program or read operation, the memory manager 128 may control the nonvolatile memory 110 using time information received from the time calculator 129.

The time calculator 129 may calculate time information using the clock signal CLK received from the host device. For example, if the clock signal CLK indicates a current time, the time calculator 129 may synchronize an internal time of the memory controller 120 with the current time using the clock signal CLK. Alternatively, if the clock signal CLK is a periodic signal indicating the lapse of time, the time calculator 129 may calculate an internal time of the memory controller 120 using the clock signal CLK. For example, the time calculator 129 may determine as a start time a time when a power is supplied to the memory controller 120, and calculate the internal time elapsing from the start time using the clock signal CLK. Or, if the clock signal CLK is a periodic signal indicating the lapse of time and indicates a current time, the time calculator 129 may determine the current time as the start time of the memory controller 120 and may calculate the internal time elapsing from the start time using the periodic signal.

The storage device 100 may perform an operation of writing, reading or erasing data according to a request of the host device. The storage device 100 may include a solid state drive (SSD) or a hard disk drive (HDD). The storage device 100 may include memory cards, such as a PC card (PCM-CIA, personal computer memory card international association), a compact flash card, a smart media card (SM, SMC), a memory stick, a multimedia card (MMC, RS-MMC, MMCmicro), a SD card (SD, miniSD, microSD, SDHC), a USB (Universal Serial Bus) memory card, a universal flash storage (UFS), and so on. The storage device 100 may include embedded memories, such as an eMMC (embedded MultiMedia Card), a UFS, a PPN (Perfect Page New), and so on.

Figure 2:
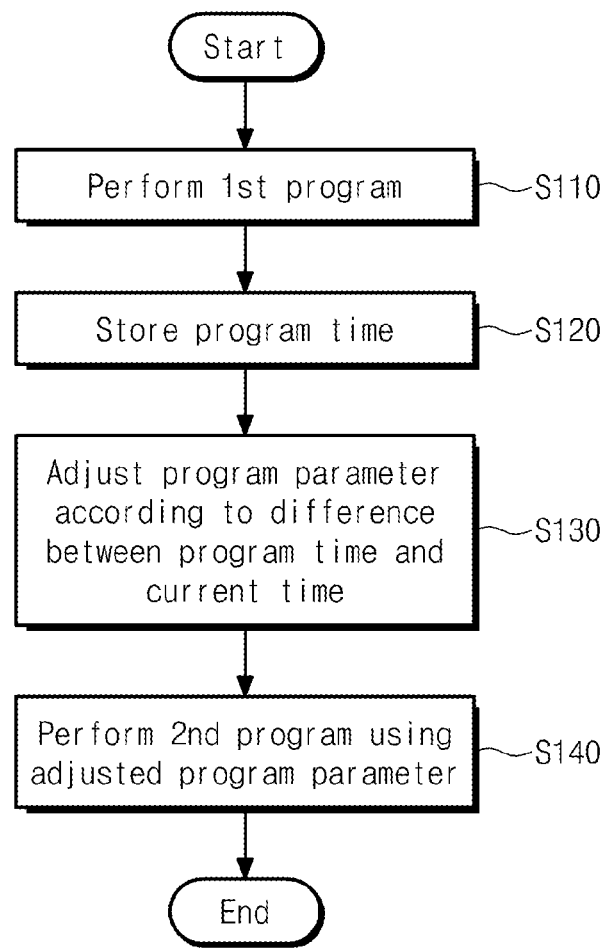
FIG. 2 is a flow chart schematically illustrating an operating method of a storage device, according to an embodiment of the inventive concept.

FIG. 2 is a flow chart schematically illustrating an operating method of storage device 100, according to an embodiment of the inventive concept. Referring to FIGS. 1 and 2, in step S110 a first program operation is performed with respect to selected memory cells. Memory manager 128 of memory controller 120 sends a first program request to nonvolatile memory 110. The first program request may contain first data DATA1, a first command CMD1, and a first address ADDR1. In response to the first command CMD1, the nonvolatile memory 110 programs the first data DATA1 at memory cells selected by the first address ADDR1.

In step S120, the memory controller 120 stores a program time. For example, the memory manager 128 acquires a time when the first program operation is performed, from time calculator 129. The time when the first program operation is performed may include a time when the first program operation begins, a time when the first program operation is being performed, a time when the first program operation ends, and/or a time just after the first program operation ends.

For example, the memory controller 120 may store correlation between the first address ADDR1 which indicates memory cells to be selected, and a program time in a table.

The memory manager 128 may internally store the program time, or may program at the program time in the nonvolatile memory 110. For example, the memory controller 120 may program the program time in the nonvolatile memory 110 without storing it in the memory controller 120. As another example, the memory controller 120 may internally store the program time, and if information of accumulated program times reaches a threshold value, the memory controller 120 may flush all or some of the accumulated program times into the nonvolatile memory 110.

In step S130, the memory controller 120 adjusts a program parameter according to a difference between the program time and a current time. In step S140, the memory controller 120 performs a second program operation with respect to the selected memory cells, using the adjusted program parameter.

For example, steps S130 and S140 may be executed when the second program operation is to be started. The memory manager 128 may acquire an internally stored program time or read a program time stored in the nonvolatile memory 110. The memory manager 128 may acquire a current time from a time calculator 129 and calculate the difference between the current time and the program time. The memory manager 128 may adjust the program parameter, based on the calculated difference. The program parameter may include a variety of information that is used when the nonvolatile memory 110 performs a program operation.

Afterwards, the memory manager 128 may transmit a first command CMD1, a first address ADDR1, and a first data DATA1. The memory manager 128 may further transmit information on an adjusted program parameter to the nonvolatile memory 110. The nonvolatile memory 110 may adjust a program parameter using the information on the adjusted program parameter. Based on the adjusted program parameter, the nonvolatile memory 110 performs the second program operation with respect to the selected memory cells, using the first data DATA1.

Figure 3:
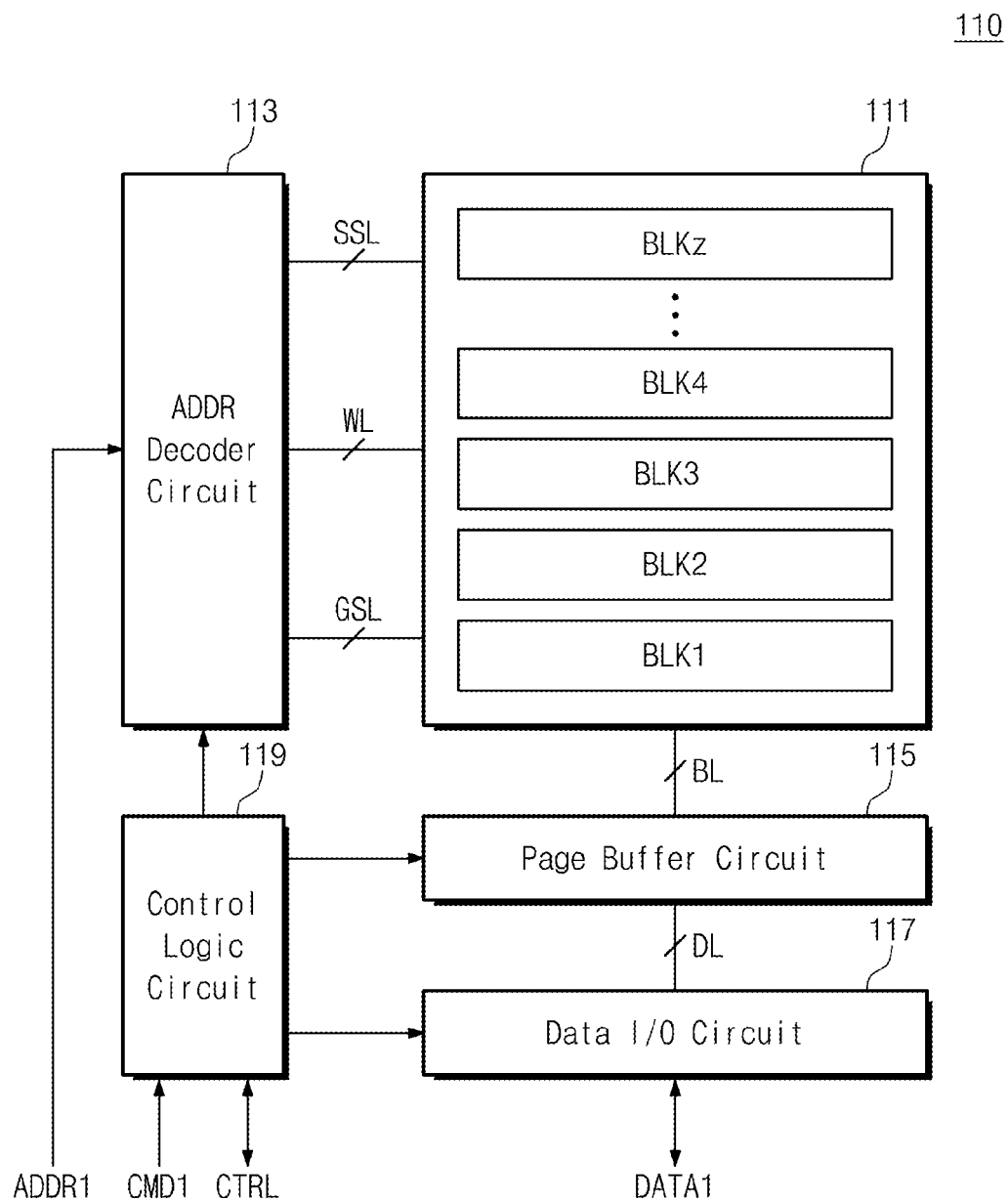
FIG. 3 is a block diagram schematically illustrating a nonvolatile memory according to an embodiment of the inventive concept.

FIG. 3 is a block diagram schematically illustrating a nonvolatile memory 110 according to an embodiment of the inventive concept. Referring to FIG. 3, nonvolatile memory 110 includes a memory cell array 111, an address decoder circuit 113, a page buffer circuit 115, a data input/output circuit 117, and a control logic circuit 119.

The memory cell array 111 may include a plurality of memory blocks BLK1 through BLKz, each of which has a plurality of memory cells. Each memory block is connected to the address decoder circuit 113 through at least one string selection line SSL, a plurality of word lines WL, and at least one ground selection line GSL. Each memory block is connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure.

The address decoder circuit 113 is connected to the memory cell array 111 through a plurality of ground selection lines GSL, the plurality of word lines WL, and a plurality of string selection lines SSL. The address decoder circuit 113 operates in response to a control of the control logic circuit 119. The address decoder circuit 113 may receive a first address ADDR1 from memory controller 120. The address decoder circuit 113 may decode the first address ADDR1 and controls voltages to be applied to the word lines WL according to the decoded address.

For example, during programming, the address decoder circuit 113 applies a program voltage to a selected word line of a selected memory block corresponding to the first address ADDR1. The address decoder circuit 113 also applies a pass voltage to unselected word lines of the selected memory block. During reading, the address decoder circuit 113 applies a selection read voltage to a selected word line of a selected memory block corresponding to the first address ADDR1. The address decoder circuit 113 also applies a non-selection read voltage to unselected word lines of the selected memory block. During erasing, the address decoder circuit 113 applies an erase voltage (e.g., ground voltage) to word lines of a selected memory block corresponding to the first address ADDR1.

The page buffer circuit 115 is connected to the memory cell array 111 through the bit lines BL. The page buffer circuit 115 is connected to the data input/output circuit 117 through a plurality of data lines DL. The page buffer circuit 115 operates in response to a control of the control logic circuit 119.

The page buffer circuit 115 holds data to be programmed at memory cells of the memory cell array 111 or data read from memory cells thereof. During a program operation, the page buffer circuit 115 stores data to be stored in memory cells. The page buffer circuit 115 biases the plurality of bit lines BL based on the stored data. The page buffer circuit 115 functions as a write driver during a program operation. During a read operation, the page buffer circuit 115 senses voltages of the bit lines BL and stores the sensed results. The page buffer circuit 115 functions as a sense amplifier during a read operation.

The data input/output circuit 117 is connected to the page buffer circuit 115 through the data lines DL. The data input/output circuit 117 exchanges first data DATA1 with the memory controller 120.

The data input/output circuit 117 temporarily stores first data DATA1 provided by the memory controller 120, and transfers the temporarily stored data to the page buffer circuit 115. The data input/output circuit 117 temporarily stores data transferred from the page buffer circuit 115 and transfers the temporarily stored data to the memory controller 120. The data input/output circuit 117 functions as a buffer memory.

The control logic circuit 119 may receive a first command CMD1 and a control signal CTRL from the memory controller 120. The control logic circuit 119 decodes the first command CMD1 thus received and controls an overall operation of the nonvolatile memory 110 according to the decoded command.

FIG. 4 is a circuit diagram schematically illustrating a memory block BLKa according to an embodiment of the inventive concept. Referring to FIG. 4, a memory block BLKa includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 through CS21 and CS12 through CS22 are connected in common to a ground selection line GSL.

In example embodiments, ground selection transistors at the same height (or order) may be connected to the same ground selection line, and ground selection transistors at different heights (or orders) may be connected to different ground selection lines. For example, the ground selection transistors GSTa at a first height may be connected in common to a first ground selection line, and the ground selection transistors GSTb at a second height may be connected in common to a second ground selection line.

In example embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row may be connected in common to the first ground selection line and the ground selection transistors GSTa and GSTb of the cell strings CS21 and CS22 in the second row may be connected in common to the second ground selection line.

Memory cells that are placed at the same height (or order) from the substrate (or the ground selection transistors GST) may be connected in common to a word line. Memory cells that are placed at different heights (or orders) may be connected to different word lines WL1 through WL6. For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

Regarding first string selection transistors SSTa at the same height (or order) of the cell strings CS11 through CS21 and CS12 through CS22, the first string selection transistors SSTa in different rows may be connected to different string selection lines SSL1*a* and SSL2*a*. For example, the first string selection transistors SSTa of the cell strings CS11 and CS12 may be connected in common to the string selection line SSL1*a*, and the first string selection transistors SSTa of the cell strings CS21 and CS22 may be connected in common to the string selection line SSL2*a*.

Regarding second string selection transistors SSTb at the same height (or order) of the cell strings CS11 through CS21 and CS12 through CS22, the second string selection transistors SSTb in different rows may be connected to the different string selection lines SSL1*b* and SSL2*b*. For example, the second string selection transistors SSTb of the cell strings CS11 and CS12 may be connected in common to the string selection line SSL1*b*, and the second string selection transistors SSTb of the cell strings CS21 and CS22 may be connected in common to the string selection line SSL2*b*.

That is, cell strings in different rows may be connected to different string selection lines. String selection transistors at the same height (or order) of cell strings in the same row may be connected to the same string selection line. String selection transistors at different heights (or orders) of cell strings in the same row may be connected to different string selection lines.

In example embodiments, string selection transistors of cell strings in the same row may be connected in common to a string selection line. For example, string selection transistors SSTa and SSTb of cell strings CS11 and CS12 in the first row may be connected in common to a string selection line, and string selection transistors SSTa and SSTb of cell strings CS21 and CS22 in the second row may be connected in common to a string selection line.

Columns of the cell strings CS11 through CS21 and CS12 through CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The memory block BLKa shown in FIG. 4 is merely an example embodiment. However, the inventive concept is not limited thereto. For example, the number of rows of cell strings may increase or decrease. As the number of rows of cell strings is changed, the number of string or ground selection lines and the number of cell strings connected to a bit line may also be changed.

The number of columns of cell strings may increase or decrease. As the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In example embodiments, write and read operations may be performed by a unit of a row of cell strings CS11 through CS21 and CS12 through CS22. The cell strings CS11 through CS21 and CS12 through CS22 may be selected by the row by activating the string selection lines SSL1*a*, SSL1*b*, SSL2*a*, and SSL2*b* selectively.

In a selected row, read and write operations may be performed by the word line. In a selected row, memory cells connected to a selected word line may be programmed.

Figure 5A:
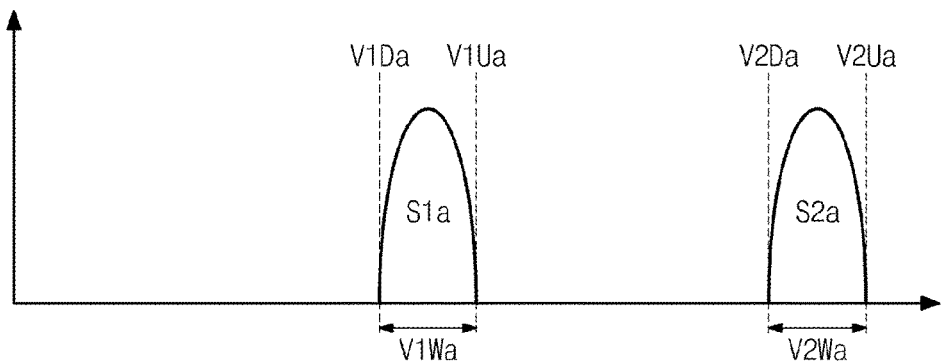
FIGS. 5A, 5B and 5C show variations in threshold voltages of memory cells of a memory block illustrated in FIG. 4 with the lapse of time.
Figure 5B:
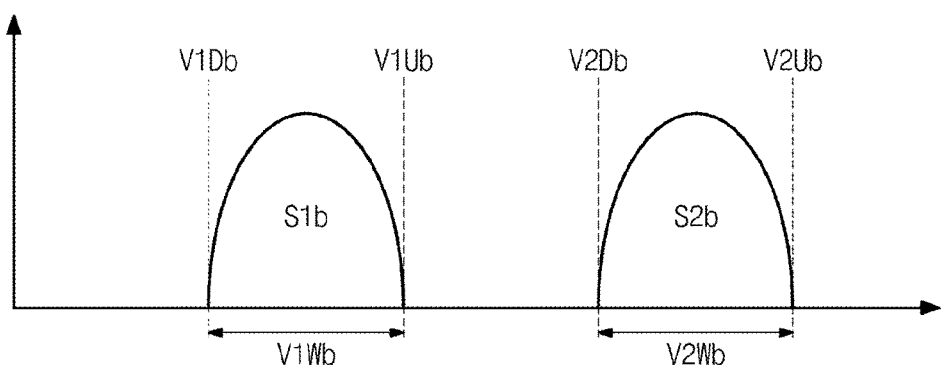
Figure 5C:
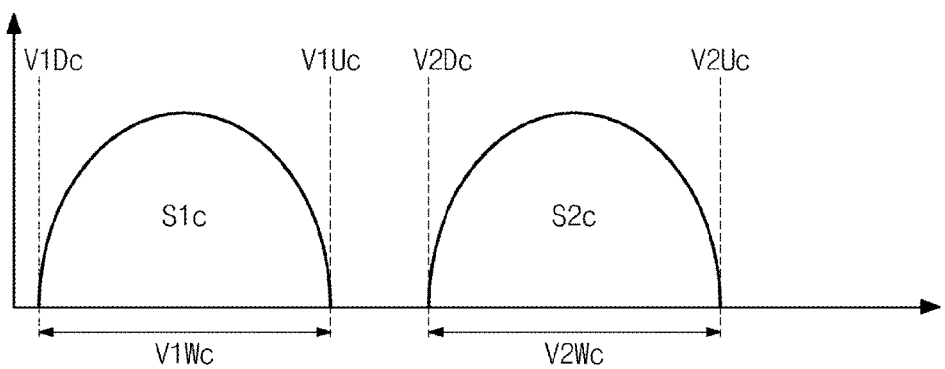

FIGS. 5A, 5B and 5C show variations in threshold voltages of memory cells MC of a memory block BLKa illustrated in FIG. 4 with the lapse of time. In FIGS. 5A, 5B and 5C, the abscissa represents a threshold voltage of a memory cell, and the ordinate represents the number of memory cells. That is, FIGS. 5A, 5B and 5C show threshold voltages of memory cells.

Referring to FIG. 4 and FIG. 5A, a threshold voltage distribution of memory cells is an S1*a* state or an S2*a* state just after programming is completed. The lower limit voltage of the S1*a* state is V1Da, and the upper limit voltage thereof is V1Ua. A threshold voltage distribution of the S1*a* state has a width of V1Wa. The lower limit voltage of the S2*a* state is V2Da, and the upper limit voltage thereof is V2Ua. A threshold voltage distribution of the S2*a* state has a width of V2Wa.

Threshold voltages of memory cells vary with the lapse of time after the memory cells are programmed. For example, if a first time T1 elapses after the memory cells are programmed, a threshold voltage distribution of the memory cells may be the S1*b* state or the S2*b* state as shown in FIG. 5B. The lower limit voltage of the S1*b* state is V1Db which is lower than V1Da, and the upper limit value thereof is V1Ub which is lower than V1Ua. A distribution width of the S1*b* state is V1Wb which is wider than V1Wa. The lower limit voltage of the S2*b* state is V2Db which is lower than V2Da, and the upper limit value thereof is V2Ub which is lower than V2Ua. A distribution width of the S2*b* state is V2Wb which is wider than V2Wa.

If a second time T2 longer than the first time T1 elapses after the memory cells are programmed, a threshold voltage distribution of the memory cells may be changed to the S1*c* state or the S2*c* state as shown in FIG. 5C. The lower limit voltage of the S1*c* state is V1Dc which is lower than V1Db, and the upper limit value thereof is V1Uc which is lower than V1Ub. A distribution width of the S1*c* state is V1Wc which is wider than V1Wb. The lower limit voltage of the S2*c* state is V2Dc which is lower than V2Db, and the upper limit value thereof is V2Uc which is lower than V2Ub. A distribution width of the S2c state is V2Wc which is wider than V2Wb.

That is, as a time elapses after memory cells are programmed, a range of threshold voltage distribution of the memory cells moves in a voltage-decreasing direction and its width increases. This phenomenon may be understand whereas memory cells are stabilized into the S1c or S2c state after being programmed to have the S1a or S2a state. This phenomenon typically occurs when the memory cells are charge trap type memory cells formed to store charge in their insulation layers.

Figure 6A:
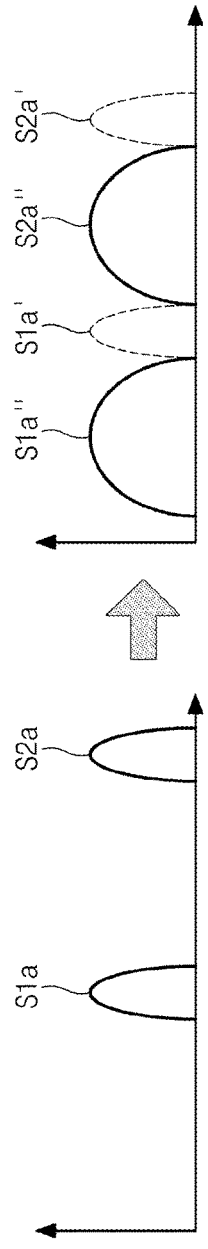
FIGS. 6A, 6B and 6C show variations in threshold voltage distributions when a second program operation is performed on memory cells.
Figure 6B:
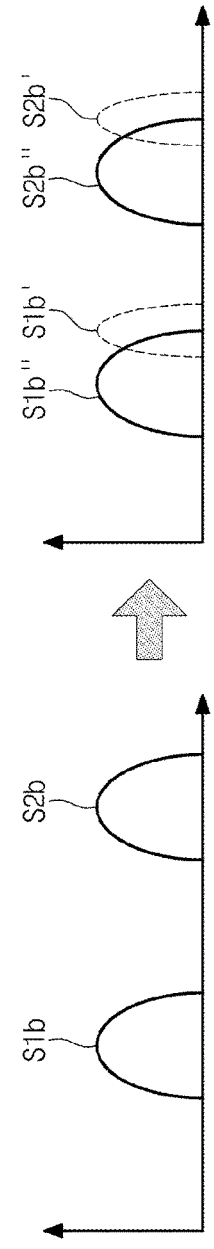
Figure 6C:
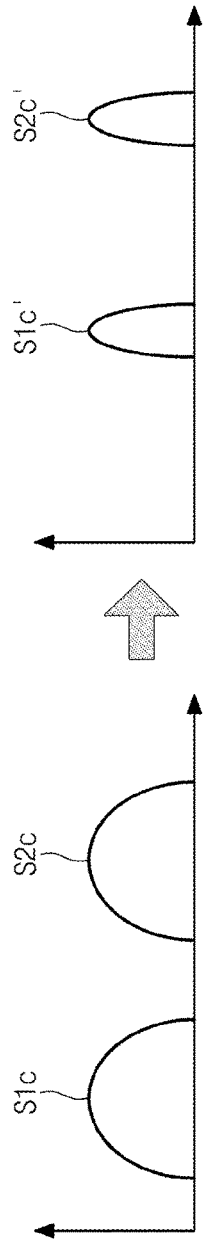

FIGS. 6A, 6B and 6C show variations in threshold voltage distributions when a second program operation (or a reprogram operation) is performed on memory cells. In FIGS. 6A, 6B and 6C, the abscissa represents a threshold voltage of a memory cell, and the ordinate represents the number of memory cells.

As shown in FIG. 6A, memory cells are first programmed to an S1a or S2a state. The memory cells are then reprogrammed just after being programmed to have an S1a' or S2a' state. However, in this case, the memory cells were not stabilized after the programming to the S1a or S2a state. Thus, after being reprogrammed to the S1a' or S2a' state, the memory cells are stabilized due to programming. For example, a threshold voltage distribution of memory cells may be stabilized into an S1a" or S2a" state from the S2a' or S2a' state.

If a first time T1 elapses after memory cells are programmed to the S1a or S2a state, a threshold voltage distribution of the memory cells may be an S1b or S2b state as shown in FIG. 6B. At this time, the memory cells are reprogrammed to the S1b' or S2b' state. However, in this case, the memory cells were not stabilized enough after the programming. Thus, after being reprogrammed, the memory cells are stabilized due to programming. Since stabilization due to programming of the memory cells occurred before reprogramming until the first time T1 had elapsed, a variation in threshold voltages of memory cells after reprogramming is less than when the first time T1 does not elapse. For example, a threshold voltage distribution of the memory cells may be changed into an S1b" or S2b" state from the S1b' or S2b' state.

If a second time T2 longer than the first time T1 elapses after memory cells are programmed to the S1a or S2a state, a threshold voltage distribution of the memory cells may be an S1c or S2c state as shown in FIG. 6C. At this time, the memory cells are reprogrammed to the S1c' or S2c' state. Since stabilization due to programming of the memory cells occurred before reprogramming until the second time T2 had elapsed, a variation in threshold voltages of memory cells after reprogramming does not occur. That is, a threshold voltage distribution of the memory cells may maintain the S1c' or S2c' state.

In the three cases shown in FIGS. 6A, 6B and 6C, memory cells are also stabilized due to reprogramming. However, stabilization due to reprogramming occurs in common in the three cases, and a description thereof is thus omitted for the sake of easy understanding.

As described above, a threshold voltage distribution of memory cells may be the S1a" state, the S1b" state or the S1c' state, or the S2a" state, the S2b" state or the S2c' state, based on a difference between a program-execution time and a reprogram-execution time. During a read operation, memory cells having the S1a", S1b", and S1c' states should be determined as having a first state, and memory cells having the S2a", S2b", or S2c' state should be determined as having a second state.

In FIG. 5 and FIGS. 6A, 6B and 6C, an embodiment of the inventive concept is exemplified as threshold voltage distributions corresponding to first and second states of memory cells are not overlapped. However, threshold voltage distributions corresponding to first and second states of memory cells can be overlapped due to various causes. This will be described with reference to FIG. 7.

Figure 7:
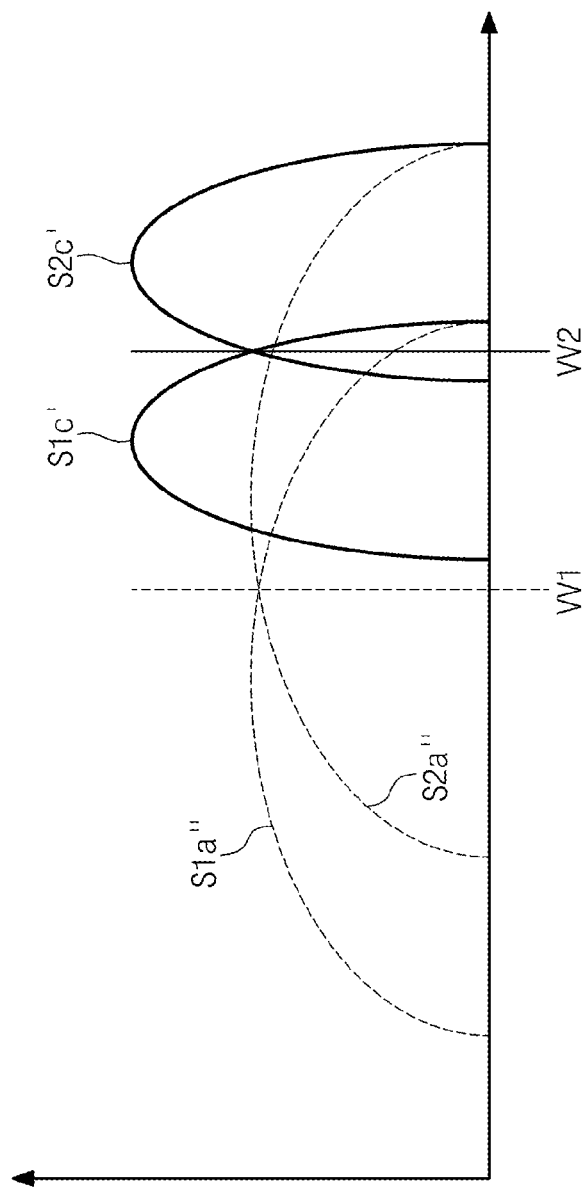
FIG. 7 shows an example where threshold voltage distributions of memory cells are overlapped.

FIG. 7 shows an example where threshold voltage distributions of memory cells are overlapped. In FIG. 7, the abscissa represents a threshold voltage of a memory cell, and the ordinate represents the number of memory cells. Referring to FIG. 7, a threshold voltage distribution of memory cells corresponding to an S1a" state is overlapped with a threshold voltage distribution of memory cells corresponding to an S2a" state. In the case threshold voltage distributions are overlapped, a valley voltage is normally used to determine states of memory cells. The valley voltage has a read level for minimizing the number of memory cells determined as a second state from among memory cells having a first state, and the number of memory cells determined as the first state from among memory cells having the second state. In the case threshold voltage distributions corresponding to the S1a" and S2a" states are overlapped, the valley voltage is VV1. In the case threshold voltage distributions corresponding to the S1c' and S2c' states are overlapped, the valley voltage is VV2.

In a nonvolatile memory 110 (refer to FIG. 1), programming and reprogramming are performed by a unit of memory cells, corresponding to a row, from among memory cells connected to a word line. Hereinafter, memory cells corresponding to a row constitute a page. Thus, a threshold voltage distribution of memory cells varies by the page in relation with a stabilization time. For example, a threshold voltage distribution of memory cells of a first page connected to a first word line WL1 may be the S1a" state or the S2a" state, and a threshold voltage distribution of memory cells of another page (second page) connected to another word line may be the S1c' state or the S2c' state. That is, a valley voltage of VV1 is necessary to read memory cells of the first page, and a valley voltage of VV2 is necessary to read memory cells of the second page.

The valley voltage is detected by performing a plurality of read operations. That is, time is taken to detect the valley voltage. If valley voltages of memory cells are equal to each other, a valley voltage detected with respect to one page may be used for another page. However, valley voltages of pages are typically different from each other as illustrated in FIG. 7. In this case, an operation of detecting a valley voltage is performed whenever a read operation is performed with respect to one page, thereby resulting in an increase in time taken to perform a read operation.

To solve such a problem, a storage device 100 according to an embodiment of the inventive concept stores a program time when a first program operation is performed, adjusts a program parameter according to a difference between the program time and a current time, and performs a second program operation using the adjusted program parameter.

FIG. 8 is a table showing program parameters, according to an embodiment of the inventive concept. Referring to FIG. 8, an elapse time means a time that elapses until a second program operation is performed after a first program operation is performed with respect to memory cells.

A program parameter may include an increment of a program voltage VPGM, a start voltage of the program voltage VPGM, a program verification voltage, a pre-charge voltage for bit line BL, and a develop time of a program verification operation.

A program operation of a nonvolatile memory 110 is executed using a plurality of program loops. Each program loop contains a program step and a program verification step.

In the program step, from among memory cells of a page (e.g., a selected page), a low voltage (e.g., a ground voltage) is applied to a bit line which is connected to a memory cell of which the threshold voltage will increase, and a positive low voltage (e.g., a power supply voltage) is applied to a bit line connected to a memory cell of which the threshold voltage will not increase. A positive low voltage (e.g., a power supply voltage) is supplied to a string selection line corresponding to the selected page, and a low voltage (e.g., a ground voltage) is provided to remaining string selection lines. A program voltage VPGM is applied to a word line including the selected page, and a pass voltage VPASS is provided to remaining word lines. The pass voltage VPASS may be a positive high voltage, and the program voltage may be a positive high voltage greater than the pass voltage VPASS.

In the program verification step, bit lines are charged with a pre-charge voltage. A non-selection read voltage VREAD is applied to a string selection line corresponding to the selected page, and a low voltage (e.g., a ground voltage) is supplied to remaining string selection lines. The non-selection read voltage VREAD may be a positive high voltage. A program verification voltage VFY is applied to a word line including the selected page, and the non-selection read voltage VREAD is provided to remaining word lines. The program verification voltage VFY may be a voltage that corresponds to the lower limit of a threshold voltage distribution of memory cells. The non-selection read voltage VREAD is applied to a ground selection line GSL, and a common source line CSL is grounded. Voltages on the bit lines are latched after a predetermined develop time elapses, and program pass or program fail is determined on the basis of the latched results.

The program loop is iterated until memory cells of the selected page have target threshold voltages. A level of the program voltage VPGM stepwise increases whenever the program loop is iterated.

Among the program parameters, the increment of the program voltage VPGM indicates an increment of the program voltage VPGM that increases whenever the program loop is iterated (or, executed). A width of a threshold voltage distribution may become wider in proportion to an increase in the increment of the program voltage VPGM.

The start voltage of the program voltage VPGM indicates a level of the program voltage VPGM that is used in a first program loop. The lower limit of a threshold voltage distribution may become lower (or, move in a voltage-decreasing direction) in proportion to a decrease in the start voltage of the program voltage VPGM.

The program verification voltage VFY is a voltage that is supplied to a word line including the selected page in the program verification step. The lower limit of a threshold voltage distribution of programmed memory cells may become lower (or, move in a voltage-decreasing direction) in proportion to a decrease in the program verification voltage VFY.

The pre-charge voltage for bit line BL is a voltage that is supplied to bit lines in the program verification step. A width of a threshold voltage distribution may increase in proportion to a decrease in the pre-charge voltage.

The develop time of the program verification operation is a waiting time when voltages on the bit lines BL vary in the program verification step. A width of a threshold voltage distribution may increase in proportion to a decrease in the develop time.

As described with reference to FIGS. 6A, 6B and 6C, if an elapse time T increases, the lower limit and the upper limit of a threshold voltage distribution of memory cells experiencing a second program operation may lower and a width of the threshold voltage distribution may widen. A program parameter may be adjusted according to the elapse time T such that threshold voltage distributions of memory cells have the same valley voltage regardless of the elapse time T. In example embodiments, a program parameter may be adjusted according to an elapse time such that memory cells have an S1a" state or an S2a" state regardless of the elapse time.

When the elapse time T is shorter than a first time T1, a program parameter is adjusted such that an increment of a program voltage VPGM, a start voltage of the program voltage VPGM, a program verification voltage, a pre-charge voltage for bit line, and a develop time of a program verification operation are set to VI1, VS1, VFY1, VPRE1, and TD1, respectively.

When the elapse time T is longer than the first time T1 and shorter than a second time T2, the program parameter is adjusted such that an increment of a program voltage VPGM, a start voltage of the program voltage VPGM, a program verification voltage, a pre-charge voltage for bit line, and a develop time of a program verification operation are set to VI2 (higher than VI1), VS2 (lower than VS1), VFY2 (lower than VFY1), VPRE2 (lower than VPRE1), and TD2 (shorter than TD1), respectively.

When the elapse time T is longer than the second time T2, the program parameter is adjusted such that an increment of a program voltage VPGM, a start voltage of the program voltage VPGM, a program verification voltage, a pre-charge voltage for bit line, and a develop time of a program verification operation are set to VI3 (higher than VI2), VS3 (lower than VS2), VFY3 (lower than VFY2), VPRE3 (lower than VPRE2), and TD3 (shorter than TD2), respectively.

In FIG. 8, an embodiment of the inventive concept is exemplified as a program parameter is adjusted according to an elapse time to have one of three conditions. However, the inventive concept is not limited thereto. For example, a program parameter may be adjusted according to an elapse time to have one of N conditions (N being an integer less than or more than 3).

In FIG. 8, an embodiment of the inventive concept is exemplified as an increment of a program voltage VPGM, a start voltage of the program voltage VPGM, a program verification voltage, a pre-charge voltage for bit line, and a develop time of a program verification operation are adjusted as a program parameter. However, the inventive concept is not limited thereto. For example, at least one of an increment of a program voltage VPGM, a start voltage of the program voltage VPGM, a program verification voltage, a pre-charge voltage for bit line, and a develop time of a program verification operation may be adjusted according to an elapse time. Also, a parameter that is not described with reference to FIG. 8 may be adjusted according to an elapse time.

Figure 9:
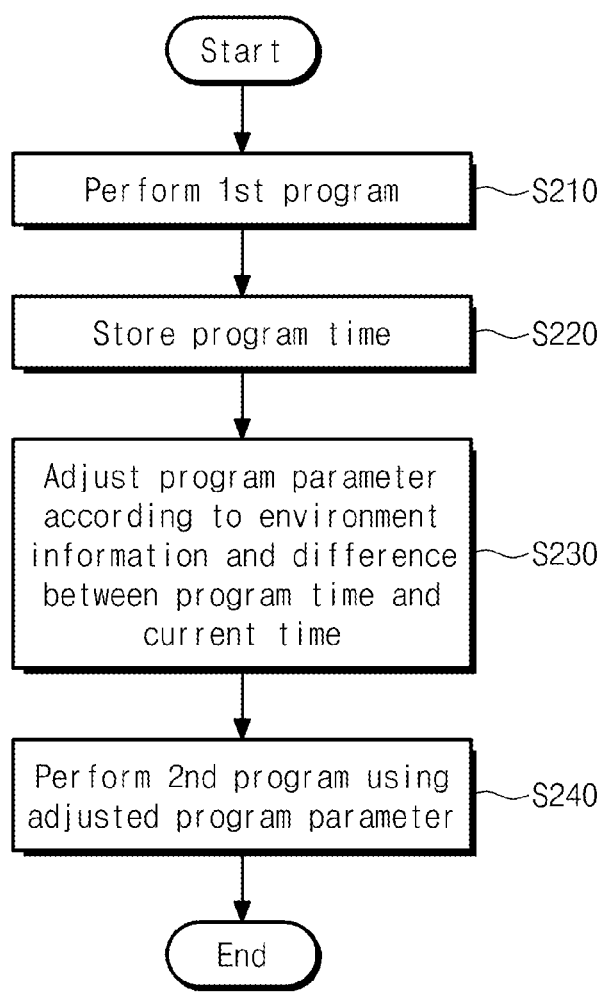
FIG. 9 is a flow chart showing an operating method of a storage device, according to a second embodiment of the inventive concept.

FIG. 9 is a flow chart showing an operating method of a storage device 100, according to a second embodiment of the inventive concept. Referring to FIGS. 1 and 9, in step S210, a first program operation is performed with respect to selected memory cells. In step S220, a program time is stored. In step S230, a program parameter is adjusted according to a difference between the program time and a current time, and according to environment information. In step S240, a second program operation is performed with respect to the selected memory cells using the adjusted program parameter.

As compared with an operating method described with reference to FIG. 2, in step S230, the program parameter is adjusted using environment information as well as a difference between the program time and a current time. For example, the environment information may contain a first temperature when the first program operation is performed, a second temperature when the second program operation is executed, or a difference between the first temperature and the second temperature. A threshold voltage distribution of memory cells may vary with a temperature. Thus, a threshold voltage distribution of memory cells may be adjusted more accurately by adjusting a program parameter on the basis of a temperature as well as a difference between a program time and a current time.

For example, the environment information may include the degree of deterioration of selected memory cells. The degree of deterioration of selected memory cells may be determined on the basis of the number of erase operations performed with respect to the selected memory cells. A threshold voltage distribution of memory cells may vary with the degree of deterioration of memory cells. If the degree of deterioration of memory cells is applied to adjust a program parameter, a threshold voltage distribution of memory cells may be adjusted more accurately. For example, the environment information may include importance of data to be programmed. If importance of data to be programmed is high, a program parameter may be adjusted such that a width of a threshold voltage distribution of memory cells becomes narrower.

Figure 10:
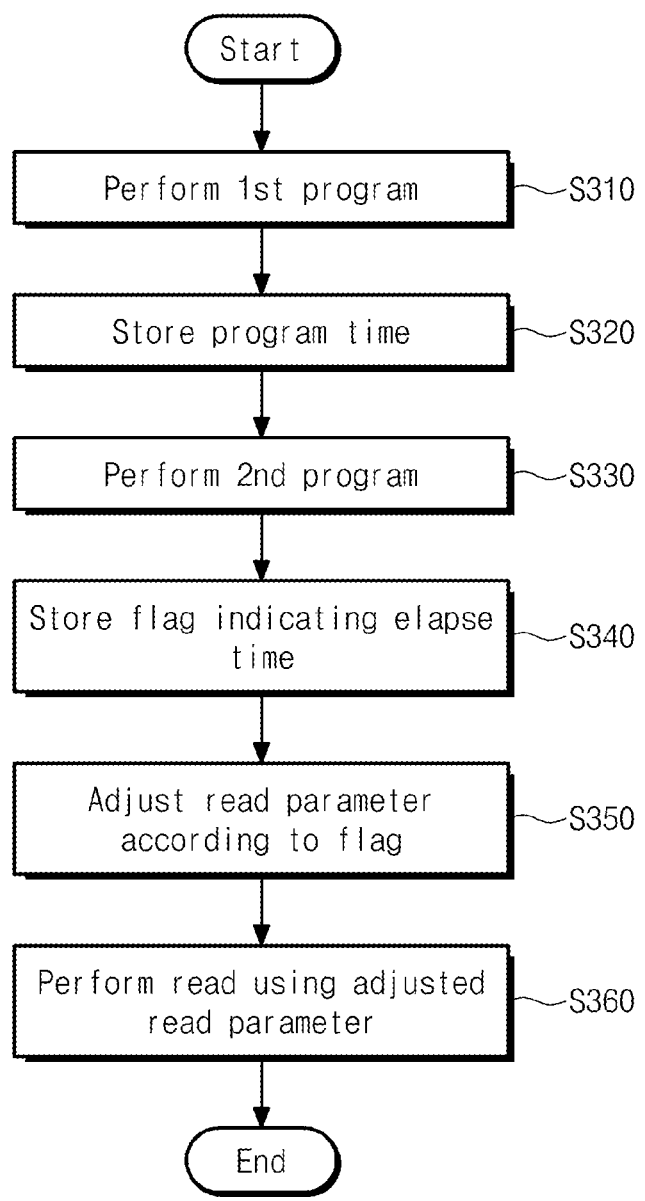
FIG. 10 is a flow chart showing an operating method of a storage device, according to a third embodiment of the inventive concept.

FIG. 10 is a flow chart showing an operating method of a storage device 100, according to a third embodiment of the inventive concept. Referring to FIGS. 1 and 10, in step S310, a first program operation is performed. In step S320, a program time is stored. Afterwards, in step S330, a second program operation is performed without adjusting a program parameter. The second program operation may be performed using the same program parameter as the first program operation. That is, if the second program operation is executed, a threshold voltage distribution may have an S1a", S1b", or S1c' state or an S2a", S2b", or S2c' state.

In step S340, a flag is stored according to an elapse time. For example, memory manager 128 may acquire a time when the second program operation is performed, from time calculator 129. The memory manager 128 calculates a difference between the time acquired from the time calculator 129 and the program time stored in step S320. The memory manager 128 generates and stores a flag according to the calculated difference.

For example, the memory manager 128 may produce a first flag when the calculated difference is shorter than a first time T1 of FIG. 8, that is when a threshold voltage distribution of memory cells experiencing the second program operation corresponds to S1a" or S2a". The memory manager 128 may produce a second flag when the calculated difference is longer than the first time T1 and shorter than a second time T2 of FIG. 8, that is when a threshold voltage distribution of memory cells experiencing the second program operation corresponds to S1b" or S2b". The memory manager 128 may produce a third flag when the calculated difference is longer than the second time T2, that is when a threshold voltage distribution of memory cells experiencing the second program operation corresponds to S1c' or S2c'.

In example embodiments, a flag may be stored in a table together with a first address ADDR1 corresponding to selected memory cells.

In example embodiments, the memory manager 128 may store a flag therein, or may program a flag in nonvolatile memory 110. For example, a memory controller 120 may program the flag in the nonvolatile memory 110 without storing the flag in the memory controller 120. The memory controller 120 may internally store the flag, and if information of accumulated flags reaches a threshold value, the memory controller 120 may flush all or some of the accumulated flags into the nonvolatile memory 110.

In step S350, a read parameter is adjusted according to the flag. In step S360, the adjusted read parameter is used to read the selected memory cells. For example, the memory manager 128 may read the stored flag and adjust a read parameter according to the flag. For example, the memory manager 128 may select a level of a read voltage according to the flag. The memory manager 128 may select an algorithm for detecting a valley voltage according to the flag. The memory manager 128 may select levels of detection voltages used to detect a valley voltage, according to the flag. The memory manager 128 may select one of previously detected valley voltages according to the flag. Step S350 and S360 may form a read sequence in which they are sequentially performed at a read operation.

In operating methods according to first and second embodiments of the inventive concept, a program parameter for a second program operation is adjusted using a difference between a time when a first program operation is performed and a time when a second program operation is performed. That is, in the first and second embodiments, schemes are used for making threshold voltage distribution states of memory cells conformable to one another.

In contrast, in an operating method according to the third embodiment, a flag is produced using a difference between a time when a first program operation is performed and a time when a second program operation is performed. Afterwards, when a read operation is performed, the flag is used to adjust a read parameter. Even though threshold voltage distribution states of memory cells change as illustrated in FIG. 6, information on the threshold voltage distribution states may be provided as a flag. Since threshold voltage distribution states of memory cells are predictable using the flag at a read operation, it is possible to compensate for variations in threshold voltage distribution states of memory cells.

Figure 11:
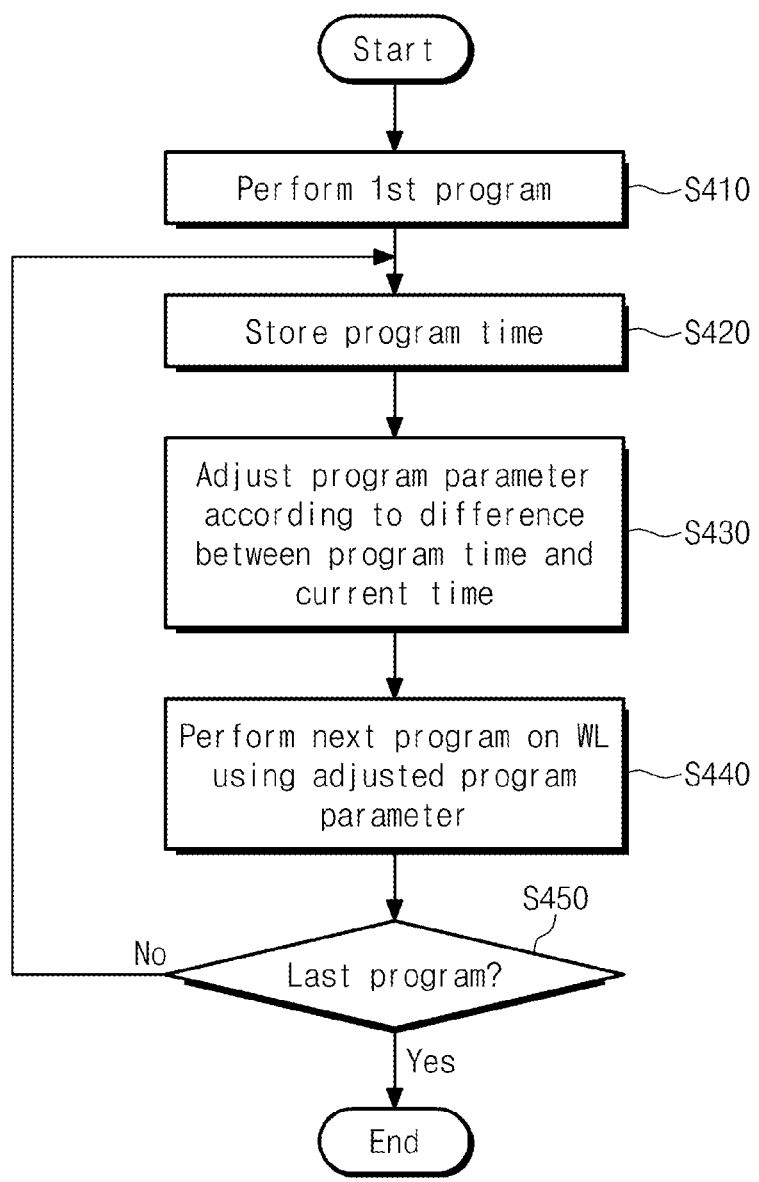
FIG. 11 is a flow chart showing an operating method of a storage device, according to a fourth embodiment of the inventive concept.

FIG. 11 is a flow chart showing an operating method of a storage device 100, according to a fourth embodiment of the inventive concept. Referring to FIGS. 1 and 11, in step S410, a first program operation is performed. The first program operation is a program operation in which selected memory cells are first programmed. In step S420, a program time is stored.

If a next program operation on the selected memory cells is issued, a program parameter may be adjusted in step S430 using a difference between the program time and a current time. In step S440, the next program operation is performed using the adjusted program parameter. In step S450, it is determined whether the last program operation has been performed. If the determination in step S450 is No, the procedure may return to step S420 in which a program time of the program operation in step S440 is stored. If determination in step S450 is Yes, the procedure may end without performing a program operation and storing a program time.

Figure 12:
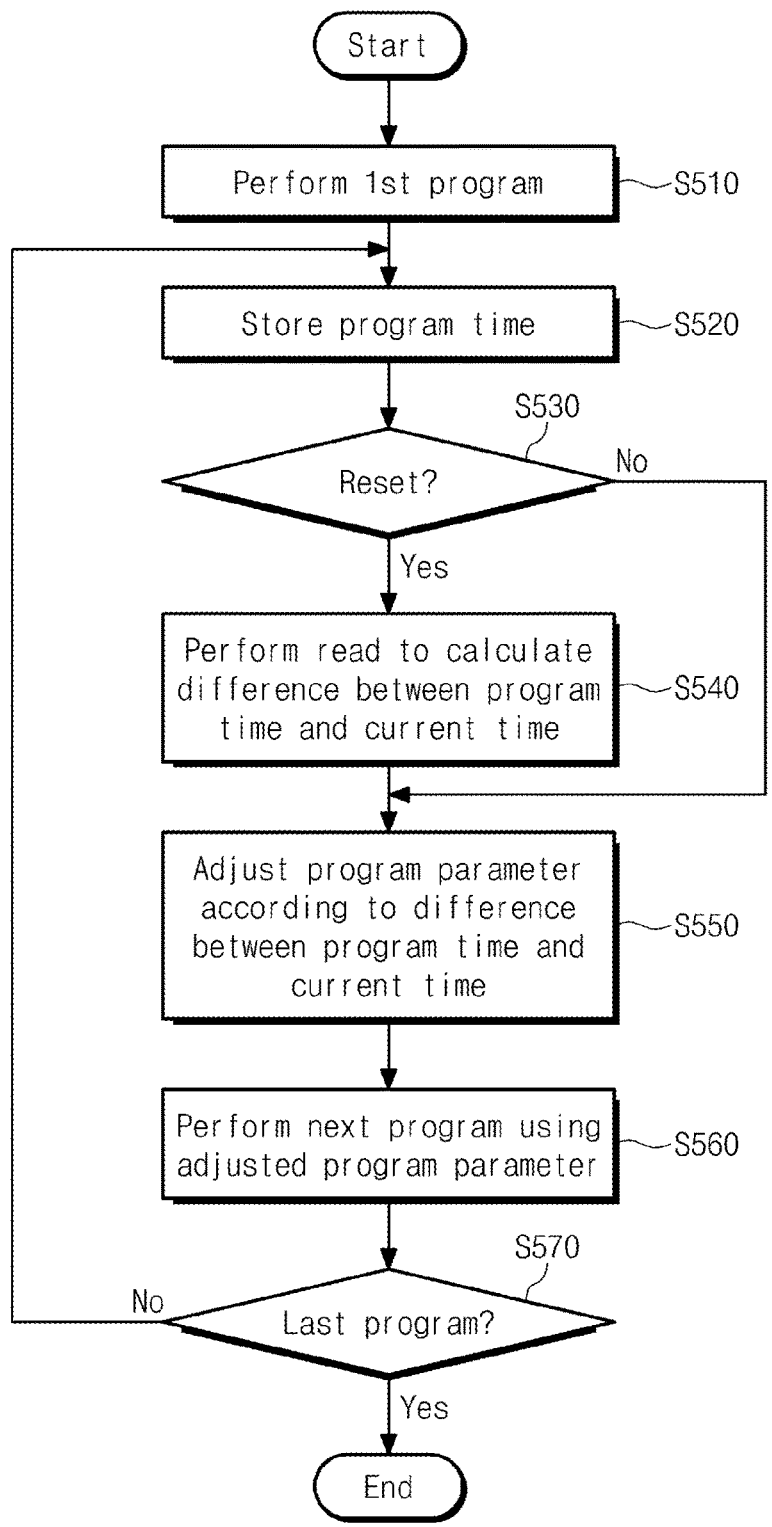
FIG. 12 is a flow chart showing an operating method of a storage device, according to a fifth embodiment of the inventive concept.

FIG. 12 is a flow chart showing an operating method of a storage device 100, according to a fifth embodiment of the inventive concept. Referring to FIGS. 1 and 12, in step S510, a first program operation is performed. The first program operation is a program operation in which selected memory cells are first programmed. Via the first program operation, a first bit may be programmed into each selected memory cell. In step S520, a program time is stored.

If a next program operation on the selected memory cells is to be performed, memory manager 128 determines in step S530 whether a reset has been performed. For example, the memory manager 128 may determine whether a power down operation and a power on operation of the storage device 100 were performed after the first program operation.

If a reset was performed, time calculator 129 initializes a time. That is, in the case a reset was performed, a stored program time is not a time associated with a current time calculated by the time calculator 129. Thus, an elapse time may be determined from a difference between a program time and a current time.

In step S540, the memory manager 128 reads selected memory cells and calculates a difference between a program time and a current time. As described with reference to FIGS. 5A, 5B and 5C, if an elapse time increases, the lower limit of a threshold voltage distribution of memory cells may become lower and a distribution width may increase. Thus, an elapse time (i.e., a difference between a program time and a current time) is calculated by determining a threshold voltage distribution range of memory cells determined through a read operation.

In step S550, a program parameter is adjusted according to a difference between a program time and a current time. In step S560, a next program operation is performed using the adjusted program parameter. In step S570, it is determined whether the last program operation has been performed. That is, it is determined whether the program operation in step S560 is the last program operation for the selected memory cells. Via the last program operation, a last bit may be programmed into each selected memory cell. If it is determined in step S570 that the program operation performed in step S560 is not the last program operation, the procedure returns to step S520, in which a program time related with the program operation performed in step S560 is stored. Afterwards, if a next program for the selected memory cells is to be performed, step S530 is again performed. If it is determined in step S570 that the last program operation has been performed, the procedure may end without performing a program operation and storing a program time.

Figure 13:
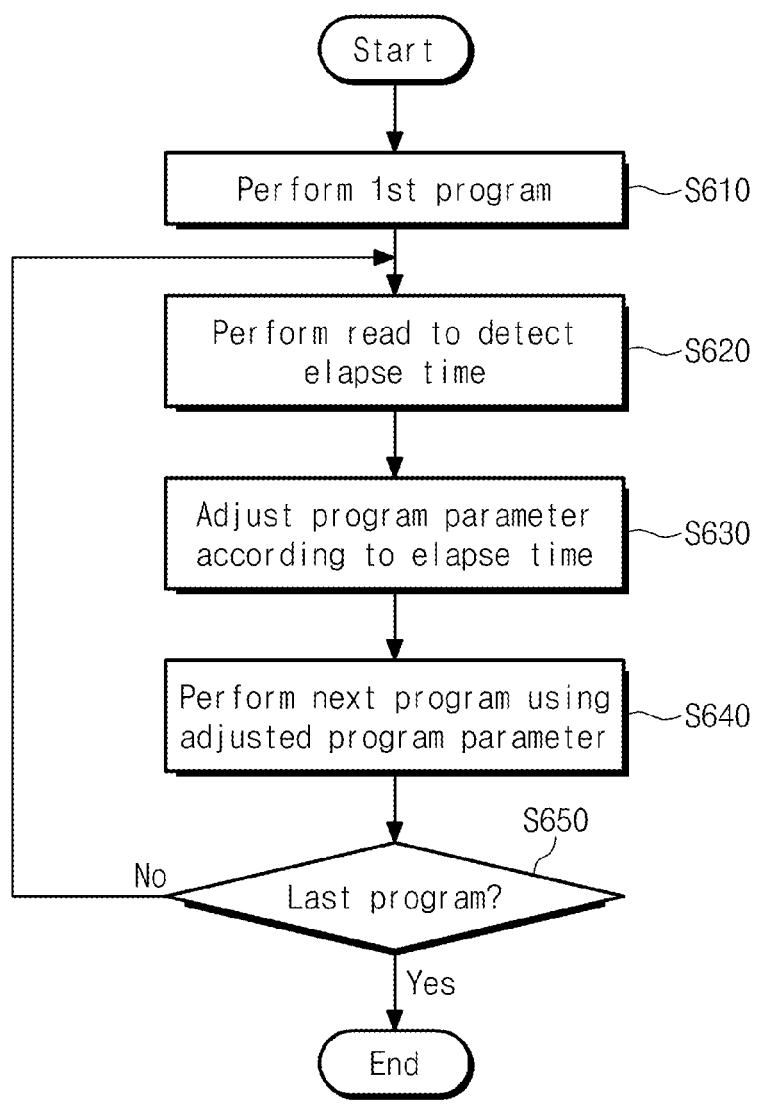
FIG. 13 is a flow chart showing an operating method of a storage device, according to a sixth embodiment of the inventive concept.

FIG. 13 is a flow chart showing an operating method of a storage device 100, according to a sixth embodiment of the inventive concept. Referring to FIGS. 1 and 13, in step S610, a first program operation is performed. The first program operation is a program operation in which selected memory cells are first programmed.

If a next program on the selected memory cells is issued (e.g., to be performed), memory manager 128 reads the selected memory cells in step S620 to detect an elapse time. In step S630, a program parameter is adjusted using the detected elapse time. In step S640, the next program is performed using the adjusted program parameter.

In step S650, it is determined whether the last program has been performed. If not, step S620 may be again performed when a next program on the selected memory cells is issued. As a consequence of determining that the last program has been performed in step S650, the method may end.

In the above-described embodiments of the inventive concept, a program parameter is adjusted when selected memory cells are reprogrammed. However, the program parameter may be adjusted only at powering-off of the storage device 100.

In example embodiments, after a program operation on memory cells of a memory block of nonvolatile memory 110 is completed, the memory manager 128 may perform a program operation on memory cells of another memory block. That is, in the case where storage device 100 operates normally, a difference between elapse times of memory cells may not be great.

However, after a first program operation is performed with respect to selected memory cells, a power of the storage device 100 may be turned off and then turned on. In this case, an elapse time of selected memory cells and an elapse time of other memory cells may be different from each other according to a power-off time of the storage device 100. Thus, a program parameter may be adjusted only after the first program operation is performed with respect to the selected memory cells and a second program operation on the selected memory cells is issued, and a power of the storage device is turned off and then turned on.

Figure 14:
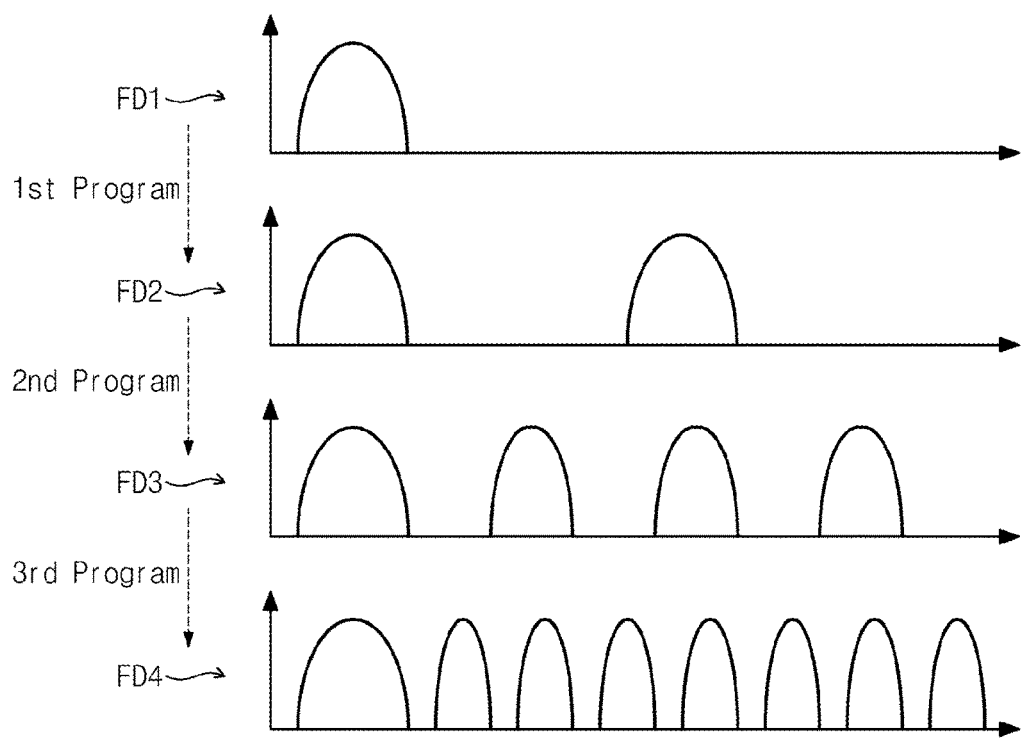
FIG. 14 is a diagram for describing how program parameters are adjusted, according to an embodiment of the inventive concept.

FIG. 14 is a diagram for describing how program parameters are adjusted, according to an embodiment of the inventive concept. In FIG. 14, the abscissa represents a threshold voltage of a memory cell, and the ordinate represents the number of memory cells.

Referring to FIG. 14, when not programmed, memory cells may have a threshold voltage distribution (refer to FD1). The memory cells may have an erase state.

If a first program operation on memory cells is performed, one bit may be programmed at each of the memory cells. In this case, the memory cells may have two threshold voltage distribution states (refer to FD2). A program time is stored when the first program operation is performed.

When a second program operation on the memory cells is performed, one bit may be further programmed at each memory cell. In this case, the memory cells may have four threshold voltage distribution states (refer to FD3). Before the second program operation is performed, a program parameter may be adjusted using a difference between the program time stored at the first program operation and a current time. A program time is stored when the second program operation is performed.

If a third program operation on the memory cells is performed, one bit may be further programmed at each memory cell. In this case, the memory cells may have eight threshold voltage distribution states (refer to FD4). Before the third program operation is performed, a program parameter is adjusted using a difference between the program time stored at the second program operation and a current time. The third program operation is performed using the adjusted program parameter.

That is, a program parameter is adjusted when one bit is additionally programmed at each memory cell.

Figure 15:
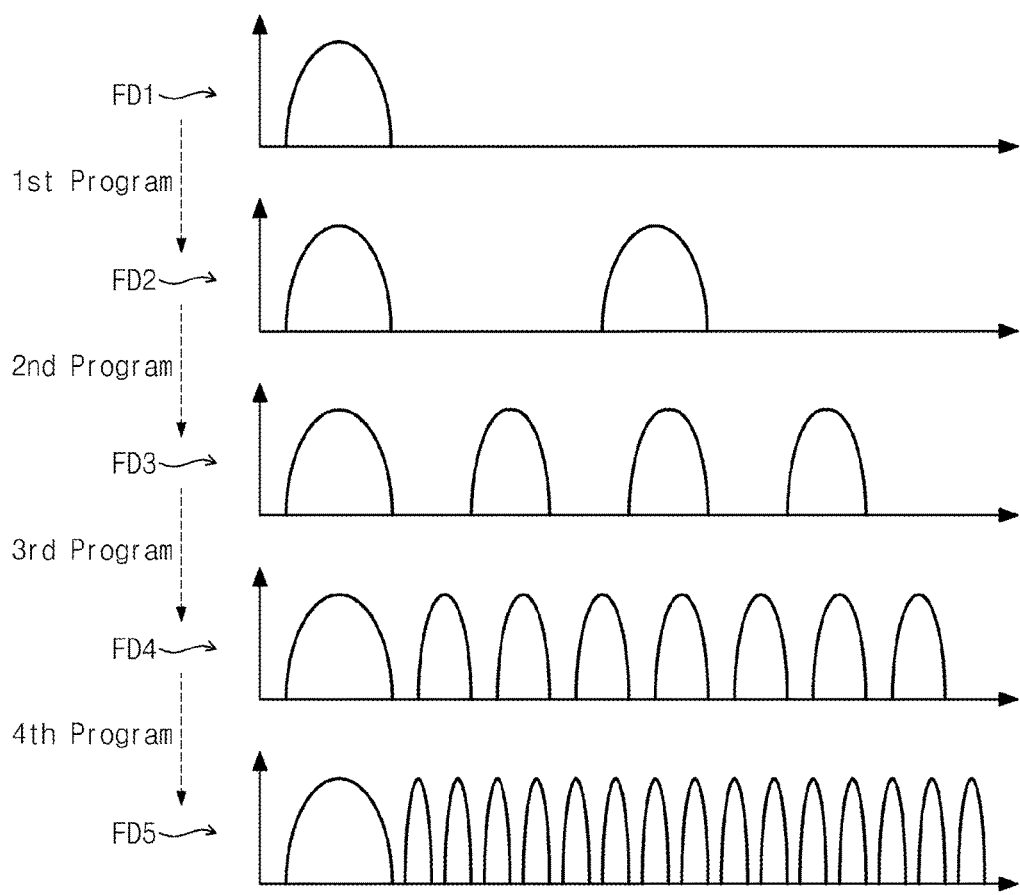
FIG. 15 is a diagram for describing how program parameters are adjusted, according to another embodiment of the inventive concept.

FIG. 15 is a diagram for describing how program parameters are adjusted, according to another embodiment of the inventive concept. In FIG. 15, the abscissa represents a threshold voltage of a memory cell, and the ordinate represents the number of memory cells.

As compared with FIG. 14, a program time is stored when a third program operation is performed. A fourth program operation is performed after the third program operation is performed. If the fourth program operation on the memory cells is performed, one bit may be further programmed at each memory cell. In this case, the memory cells may have 16 threshold voltage distribution states (refer to FD5). Before the fourth program operation is performed, a program parameter is adjusted using a difference between the program time stored at the third program operation and a current time. The fourth program operation is performed using the adjusted program parameter.

Figure 16:
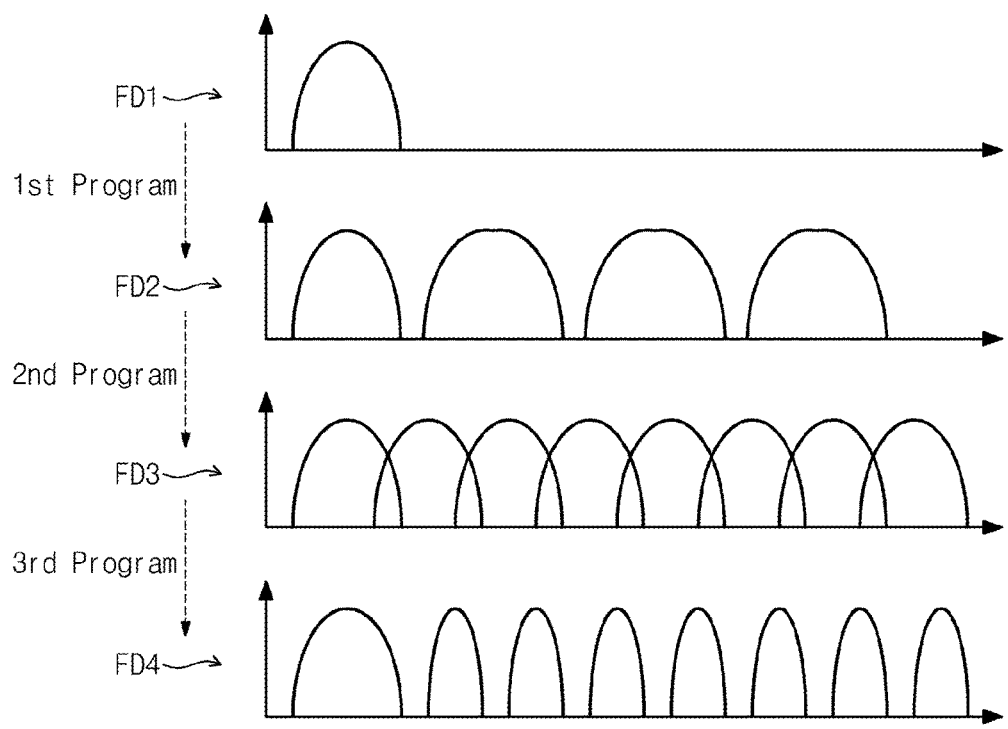
FIG. 16 is a diagram for describing how program parameters are adjusted, according to still another embodiment of the inventive concept.

FIG. 16 is a diagram for describing how program parameters are adjusted, according to still another embodiment of the inventive concept. In FIG. 16, the abscissa represents a threshold voltage of a memory cell, and the ordinate represents the number of memory cells.

Referring to FIG. 16, if a first program operation on memory cells is performed, two bits may be programmed at each of the memory cells. In this case, the memory cells may have four threshold voltage distribution states (refer to FD2). A program time is stored when the first program operation is performed.

When a second program operation on the memory cells is performed, one bit may be further programmed at each memory cell. In this case, the memory cells may have eight threshold voltage distribution states (refer to FD3). Before the second program operation is performed, a program parameter is adjusted using a difference between the program time stored at the first program operation and a current time. A program time is stored when the second program operation is performed. The second program operation is performed using the adjusted program parameter.

A third program operation performed with respect to the memory cells makes distribution widths of threshold voltage distribution states of the memory cells narrow. In this case, the memory cells may have eight threshold voltage distribution states (refer to FD4). Before a third program operation is performed, a program parameter is adjusted using a difference between the program time stored at the second program operation and a current time. The third program operation is performed using the adjusted program parameter.

Figure 17:
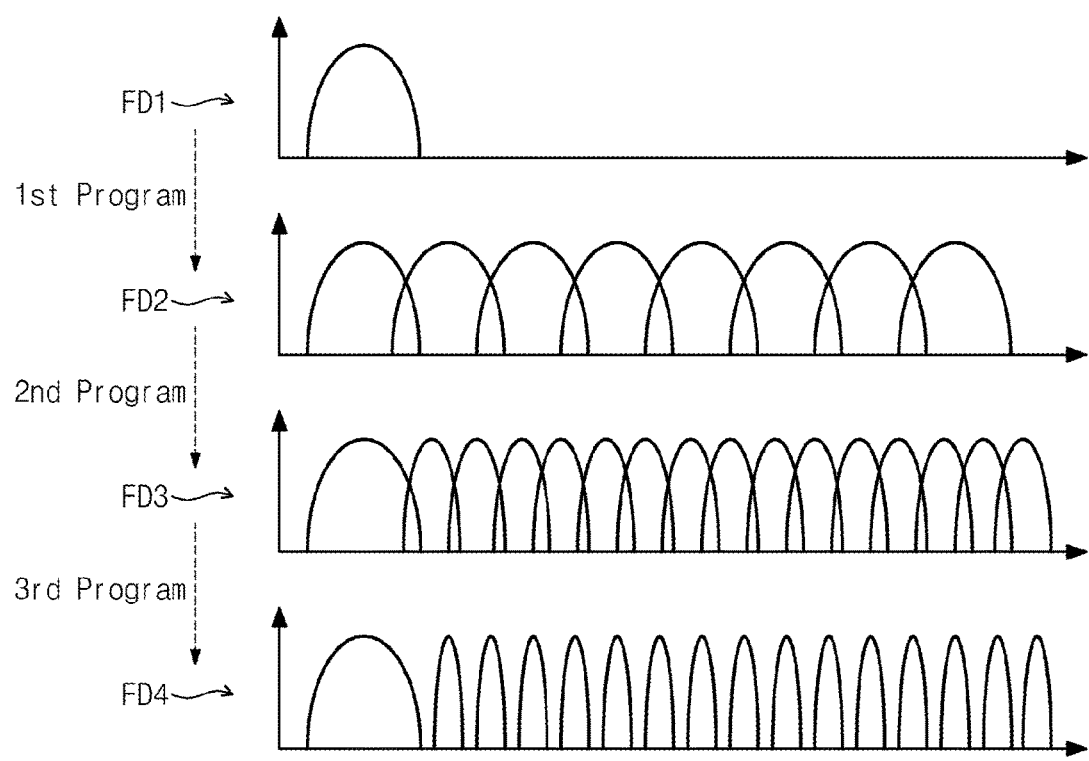
FIG. 17 is a diagram for describing how program parameters are adjusted, according to a further embodiment of the inventive concept.

FIG. 17 is a diagram for describing how program parameters are adjusted, according to a further embodiment of the inventive concept. In FIG. 17, the abscissa represents a threshold voltage of a memory cell, and the ordinate represents the number of memory cells.

Referring to FIG. 17, if a first program operation on memory cells is performed, three bits may be programmed at each of the memory cells. In this case, the memory cells form eight threshold voltage distribution states (refer to FD2). A program time is stored when the first program operation is performed.

When a second program operation on the memory cells is performed, one bit may be further programmed at each memory cell. In this case, the memory cells may have 16 threshold voltage distribution states (refer to FD3). Before the second program operation is performed, a program parameter is adjusted using a difference between the program time stored at the first program operation and a current time. The second program operation is performed using the adjusted program parameter.

A third program operation performed with respect to the memory cells makes distribution widths of threshold voltage distribution states of the memory cells narrow. In this case, the memory cells may have 16 threshold voltage distribution states (refer to FD4). Before a third program operation is performed, a program parameter is adjusted using a difference between the program time stored at the second program operation and a current time. The third program operation is performed using the adjusted program parameter.

Figure 18:
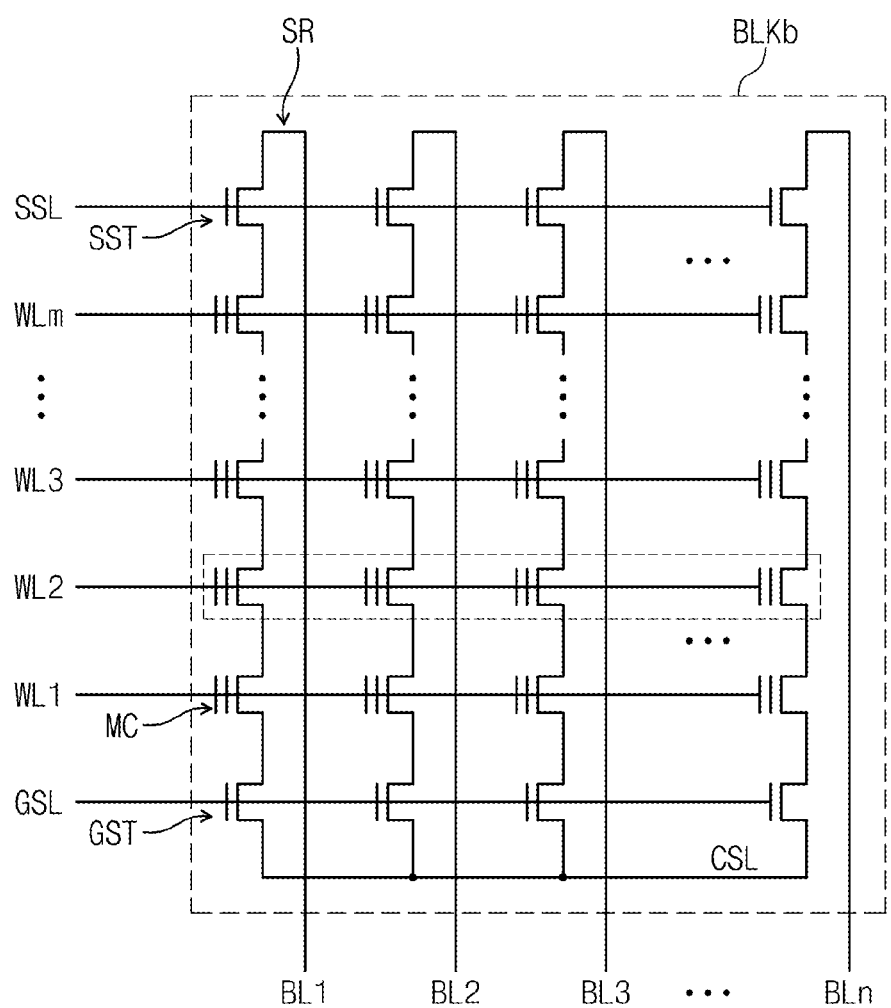
FIG. 18 is a circuit diagram schematically illustrating a memory block according to another embodiment of the inventive concept.

FIG. 18 is a circuit diagram schematically illustrating a memory block BLKb according to another embodiment of the inventive concept. Referring to FIG. 18, a memory block BLKb includes a plurality of strings SR, which are connected to a plurality of bit lines BL1 through BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL.

In each string SR, the string selection transistor SST is connected between the memory cells MC and a bit line BL. The string selection transistors SST of the strings SR are connected to a plurality of bit lines BL1 through BLn, respectively.

In each string SR, the plurality of memory cells MC are connected between the ground selection transistor GST and the string selection transistor SST. In each string SR, the plurality of memory cells MC are connected in series.

In the strings SR, memory cells MC at the same height from the common source line CSL are connected in common to a word line. The memory cells MC of the strings SR are connected to a plurality of word lines WL1 through WLm.

Figure 19:
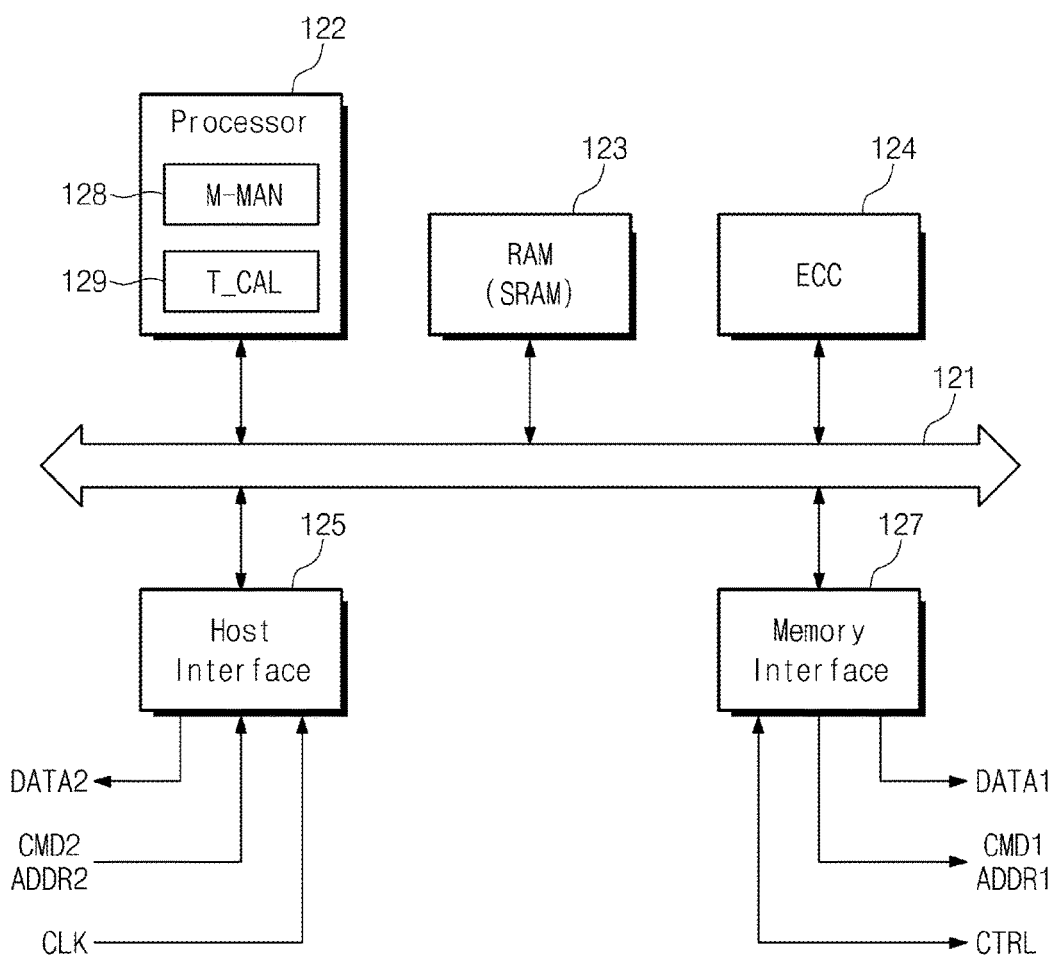
FIG. 19 is a block diagram schematically illustrating a memory controller according to an embodiment of the inventive concept.

FIG. 19 is a block diagram schematically illustrating a memory controller 120 according to an embodiment of the inventive concept. Referring to FIGS. 1 and 19, a memory controller 120 contains a bus 121, a processor 122, a RAM 123, an ECC block 124, a host interface 125, and a memory interface 127.

The bus 121 may be configured to provide a channel among components of the memory controller 120.

The processor 122 controls an overall operation of the memory controller 120 and executes a logical operation. The processor 122 communicates with an external host through the host interface 125. The processor 122 receives a clock signal CLK, a second command CMD2, and a second address ADDR2 through the host interface 125. The processor 122 exchanges second data DATA2 with an external host device through the host interface 125. The processor 122 exchanges first data DATA1 and a control signal CTRL with nonvolatile memory 110 through the memory interface 127. The processor 122 outputs a first command CMD1 and a first address ADDR1 to the nonvolatile memory 110.

The processor 122 stores the second command CMD2 or the second address ADDR2 received via the host interface 125 in the RAM 123. The processor 122 stores second data DATA2 received via the host interface 125 in the RAM 123. The processor 122 generates a first command CMD1 and a first address ADDR1 according to the second command CMD2 or the second address ADDR2 stored in the RAM 123 and outputs the first command CMD1 and the first address ADDR1 via the memory interface 127. The processor 122 outputs second data DATA2 stored in the RAM 123 via the memory interface 127 as first data DATA1. The processor 122 stores first data DATA1 received via the memory interface 127 in the RAM 123. The processor 122 may output first data DATA1 stored in the RAM 123 as second data DATA2. For example, the processor 122 may include a direct memory access (DMA) and may output data using the DMA.

The processor 122 contains a memory manager 128 and a time calculator 129 that are described with reference to FIG. 1. The memory manager 128 and/or the time calculator 129 may be implemented with hardware as a component of the processor 122. The memory manager 128 and/or the time calculator 129 may be implemented by software that the processor 122 drives.

The RAM 123 is used as a working memory, a cache memory, or a buffer memory of the processor 122. The RAM 123 stores codes or instructions that the processor 122 executes. The RAM 123 stores data processed by the processor 122. The RAM 123 may include an SRAM.

The ECC block 124 performs an error correction operation. The ECC block 124 generates parity for error correction based on data to be output to the memory interface 127. Data and parities may be output through the memory interface 127. The ECC block 124 corrects an error of data using data and parities that are received through the memory interface 127.

The host interface 125 communicates with the external host according to a control of the processor 122. The host interface 125 may communicate using at least one of various communication protocols such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), and so on.

The memory interface 127 is configured to communicate with a nonvolatile memory 110 according to a control of the processor 122.

In example embodiments, the processor 122 controls the memory controller 120 using codes. The processor 122 may load codes from a nonvolatile memory (e.g., read only memory) that is implemented in the memory controller 120. Or, the processor 122 may load codes received from the memory interface 127.

Figure 20:
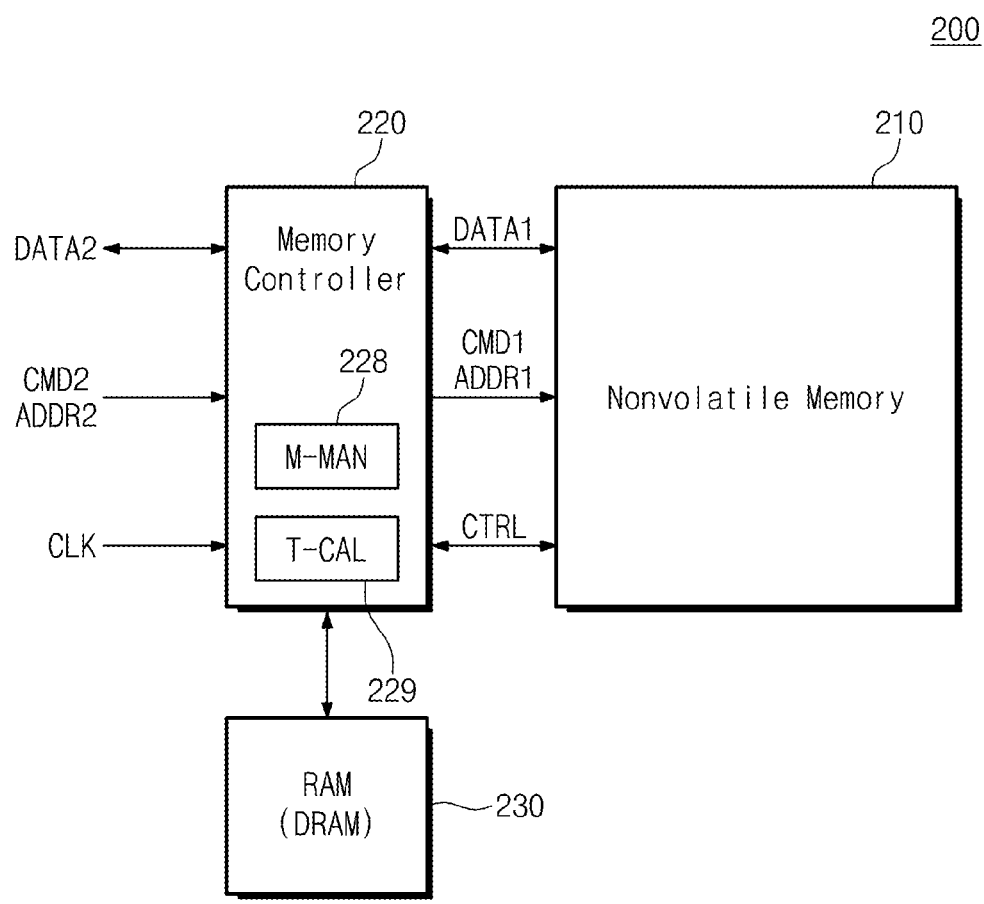
FIG. 20 is a block diagram schematically illustrating a storage device according to another embodiment of the inventive concept.

FIG. 20 is a block diagram schematically illustrating a storage device 200 according to another embodiment of the inventive concept. Referring to FIG. 20, a storage device 200 includes a nonvolatile memory 210, a memory controller 220, and a RAM 230. The memory controller 220 includes a memory manager 228 and a time calculator 229.

As compared to a storage device 100 illustrated in FIG. 1, the storage device 200 further includes the RAM 230. The RAM 230 may include at least one of a variety of random access memories, such as, but not limited to, a static RAM, a dynamic RAM, a Phase-change RAM (PRAM), a Magnetic RAM (MRAM), a Resistive RAM (RRAM), a Ferroelectric RAM (FRAM), and so on.

The memory controller 220 stores second data DATA2 from an external host device in the RAM 230. The memory controller 220 stores first data DATA1 read from the nonvolatile memory 210 in the RAM 230. The memory controller 220 transfers data stored in the RAM 230 to the nonvolatile memory 210 as first data DATA1 or to the host device as second data DATA2. The RAM 230 may be used as a working memory, a buffer memory or a cache memory of the storage device 200.

Figure 21:
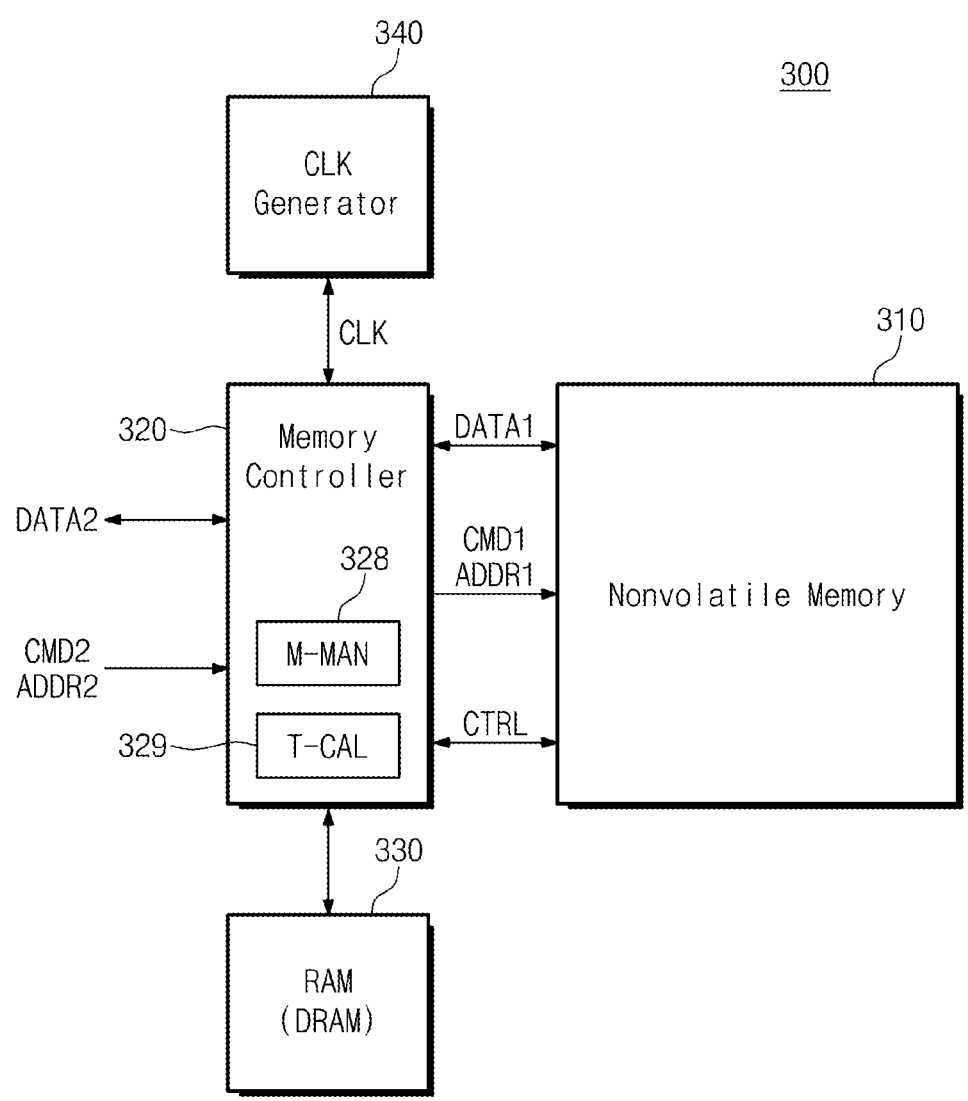
FIG. 21 is a block diagram schematically illustrating a storage device according to still another embodiment of the inventive concept.

FIG. 21 is a block diagram schematically illustrating a storage device 300 according to still another embodiment of the inventive concept. Referring to FIG. 21, a storage device 300 contains a nonvolatile memory 310, a memory controller 320, a RAM 330, and a clock generator 340. The memory controller 320 includes a memory manager 328 and a time calculator 329.

As compared with a storage device 200 of FIG. 20, the storage device 300 further comprises the clock generator 340. The clock generator 340 generates a current time in real time. For example, the clock generator 340 may contain circuits which generate a time, such as an oscillator, a phase locked loop, and so on. The memory controller 320 acquires a clock signal CLK from the clock generator 340 without receiving a clock signal from an external host device.

Figure 22:
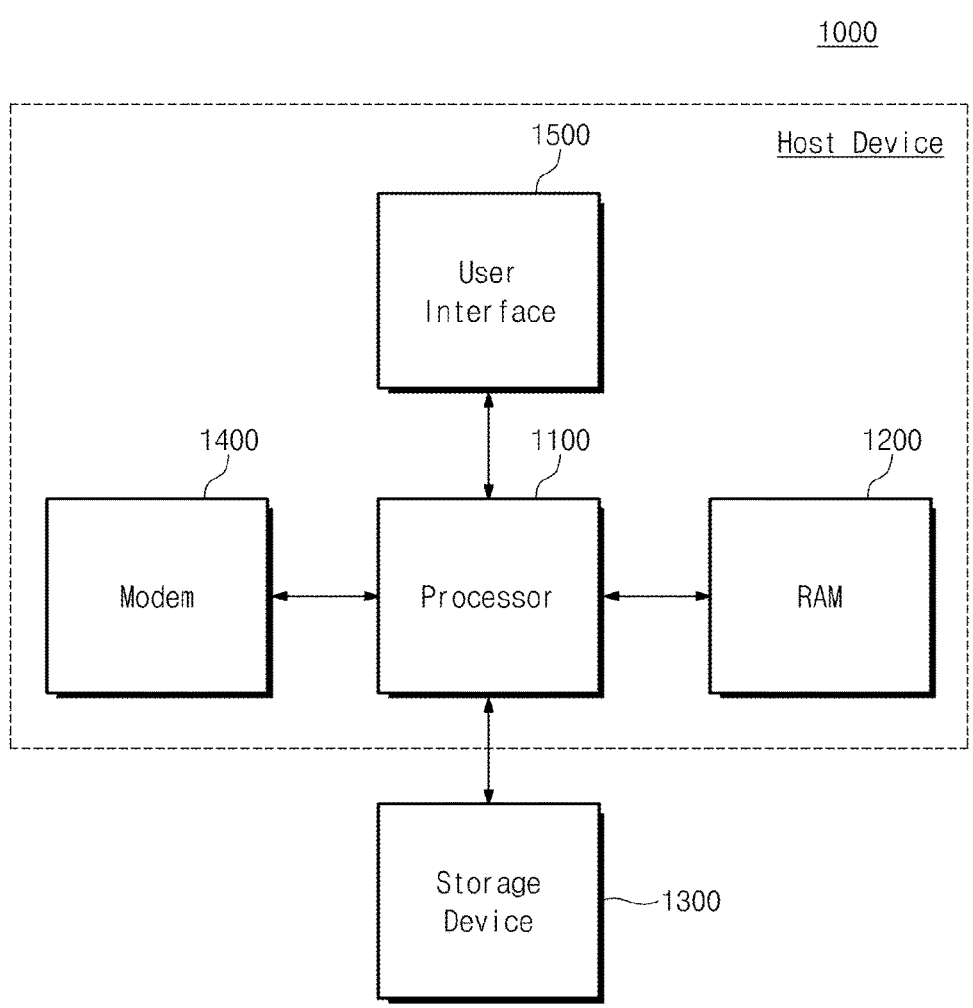
FIG. 22 is a block diagram schematically illustrating a computing device according to an embodiment of the inventive concept.

FIG. 22 is a block diagram schematically illustrating a computing device 1000 according to an embodiment of the inventive concept. Referring to FIG. 22, a computing device 1000 includes a processor 1100, a RAM 1200, a storage device 1300, a modem 1400, and a user interface 1500.

The processor 1100 controls an overall operation of the computing device 1000 and performs a logical operation. The processor 1100 may be formed of a system-on-chip (SoC). The processor 1100 may be a general purpose processor, a specific-purpose processor, or an application processor.

The RAM 1200 communicates with the processor 1100. The RAM 1200 may be a main memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, using the RAM 1200. The processor 1100 controls an overall operation of the computing device 1000 using the RAM 1200. The RAM 1200 may include a volatile memory such as, but not limited to, a static RAM, a dynamic RAM, a synchronous DRAM, and so on, or a nonvolatile memory such as, but not limited to, a Phase-change RAM (PRAM), a Magnetic RAM (MRAM), a Resistive RAM (RRAM), a Ferroelectric RAM (FRAM), and so on.

The storage device 1300 communicates with the processor 1100. The storage device 1300 is used to store data for a long time. That is, the processor 1100 stores data, which is to be stored for a long time, in the storage device 1300. The storage device 1300 stores a boot image for driving the computing device 1000. The storage device 1300 stores source codes of a variety of software, such as an operating system and an application. The storage device 1300 stores data that is processed by a variety of software, such as an operating system and an application.

In example embodiments, the processor 1100 loads source codes stored in the storage device 1300 on the RAM 1200. The codes loaded on the RAM 1200 are executed to run a variety of software, such as an operating system, an application, and so on. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 1400 communicates with an external device according to a control of the processor 1100. For example, the modem 1400 communicates with the external device in a wire or wireless manner. The modem 1400 may communicate with the external device, based on at least one of wireless communications protocols such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on, or wire communications protocols such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 1500 communicates with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an OLED (Organic Light Emitting Diode) display device, an AMOLED (Active Matrix OLED) display device, an LED, a speaker, a motor, and so on.

The storage device 1300 may include at least one of storage devices 100 and 200 according to embodiments of the inventive concept. The storage device 1300 may contain a RAM and a safe encoder and decoder block. The processor 1100, RAM 1200, modem 1400, and user interface 1500 may constitute a host device that communicates with the storage device 1300.

Figure 23:
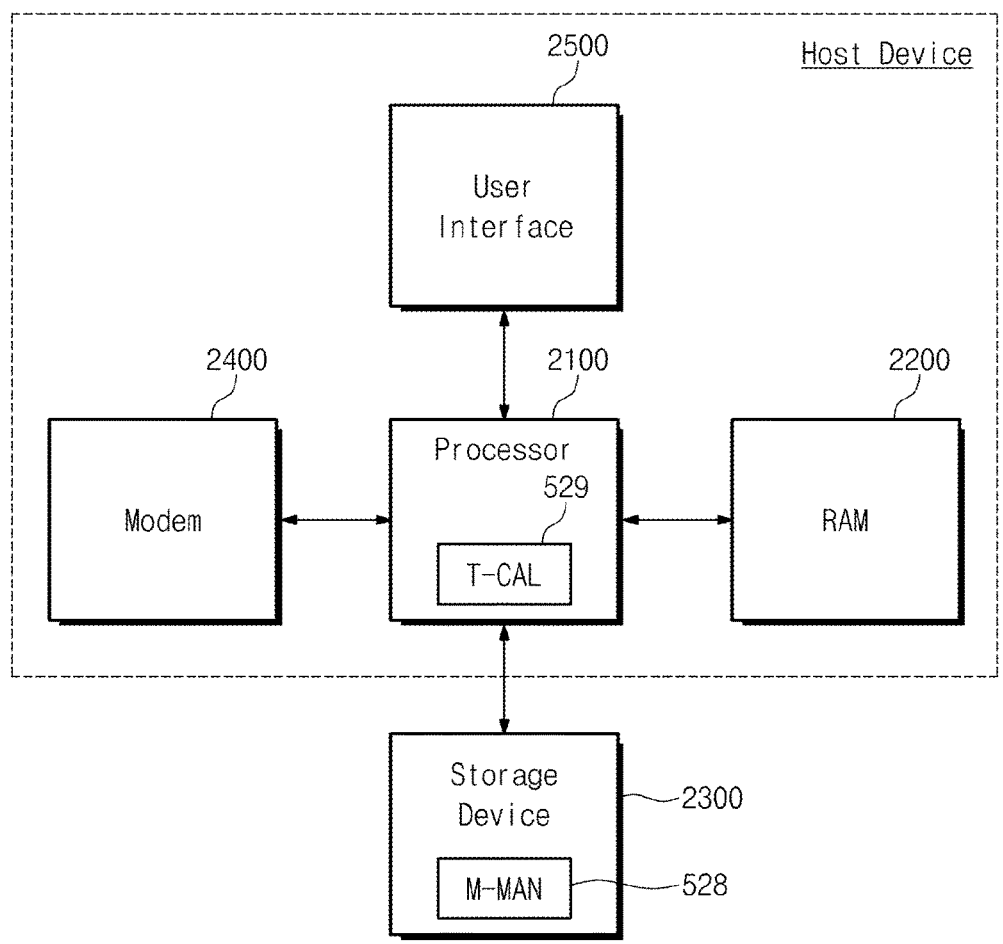
FIG. 23 is a block diagram schematically illustrating a computing device according to another embodiment of the inventive concept.

FIG. 23 is a block diagram schematically illustrating a computing device 2000 according to another embodiment of the inventive concept. Referring to FIG. 23, a computing device 2000 contains a processor 2100, a RAM 2200, a storage device 2300, a modem 2400, and a user interface 2500.

The storage device 2300 contains a memory manager 528. The processor 2100 contains a time calculator 529. When a first program operation is performed with respect to selected memory cells of a storage device, the processor 2100 stores a program time using a time acquired through the time calculator 529. The program time is stored in the RAM 2200 or the storage device 2300. When a second program operation is performed with respect to the selected memory cells, the processor 2100 calculates a difference between a program time and a current time using a time acquired through the time calculator 529. The processor 2100 adjusts a program parameter using the calculated difference. The processor 2100 sends the adjusted program parameter and a program request to the storage device 2300. The memory manager 528 performs a second program operation on the selected memory cells according to the adjusted program parameter and the program request.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An operating method of a storage device which includes a nonvolatile memory, comprising:
performing a first program operation on selected memory cells of the nonvolatile memory, and storing a first time when the first program operation is performed;
adjusting a program parameter according to a difference between the first time and a second time; and
performing a second program operation on the selected memory cells using the adjusted program parameter,
wherein the second time is a time when the second program operation is performed,
wherein during the second program operation, a program voltage is iteratively applied to a word line connected to the selected memory cells,
wherein the program parameter comprises an increment of the program voltage iteratively applied to the word line, and
wherein the adjusting comprises increasing the increment as the difference increases.

2. The operating method of claim 1, further comprising:
storing the second time;
readjusting the program parameter according to a difference between the second time and a third time; and
performing a third program operation on the selected memory cells using the readjusted program parameter,
wherein the third time is a time when the third program operation is performed.

3. The operating method of claim 1, further comprising:
performing a read operation on the selected memory cells when a reset of the storage device occurs after the first program operation is performed and before the second program operation is performed,
wherein the difference is calculated according to a result of the read operation.

4. The operating method of claim 1, wherein the first time is stored in the nonvolatile memory, and
wherein during the performing of the second program operation, the first time is read from the nonvolatile memory and the program parameter is adjusted according to the difference between the read first time and the second time.

5. The operating method of claim 1, wherein the first program operation and the second program operation comprise programming the selected memory cells using a same data.

6. The operating method of claim 1, further comprising:
receiving a clock signal,
wherein an internal time of the storage device is counted according to the clock signal, and
wherein the first and second times are acquired based on the internal time.

7. The operating method of claim 6, wherein the clock signal is a signal that periodically transitions and indicates lapse of time or information on an actual time.

8. The operating method of claim 1, wherein the first program operation programs the selected memory cells to at least two states, and the second program operation programs the selected memory cells to the same at least two states.

9. An operating method of a storage device which includes a nonvolatile memory, comprising:
performing a first program operation on selected memory cells of the nonvolatile memory, and storing a first time when the first program operation is performed;
adjusting a program parameter according to a difference between the first time and a second time; and
performing a second program operation on the selected memory cells using the adjusted program parameter,
wherein the second time is a time when the second program operation is performed, and
wherein the selected memory cells are programmed by the first program operation and the second program operation without an erase operation between the first program operation and the second program operation.

10. An operating method of a storage device which includes a nonvolatile memory, comprising:
performing a first program operation on selected memory cells of the nonvolatile memory, and storing a first time when the first program operation is performed;

adjusting a program parameter according to a difference between the first time and a second time; and performing a second program operation on the selected memory cells using the adjusted program parameter, wherein the second time is a time when the second program operation is performed, and wherein the first program operation programs the selected memory cells to at least two states, and the second program operation programs the selected memory cells to more than the at least two states.

\* \* \* \* \*